(12) United States Patent
Kanno

(10) Patent No.: US 6,985,056 B2
(45) Date of Patent: Jan. 10, 2006

(54) HIGH-FREQUENCY CIRCUIT AND HIGH-FREQUENCY PACKAGE

(75) Inventor: Hiroshi Kanno, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 16 days.

(21) Appl. No.: 10/781,789

(22) Filed: Feb. 20, 2004

(65) Prior Publication Data
US 2004/0174228 A1 Sep. 9, 2004

Related U.S. Application Data

(63) Continuation of application No. PCT/JP03/15452, filed on Dec. 3, 2003.

(30) Foreign Application Priority Data

Dec. 5, 2002 (JP) .............................. 2002-354081
Jun. 3, 2003 (JP) .............................. 2003-157912

(51) Int. Cl.
*H01P 3/08* (2006.01)
*H01P 1/24* (2006.01)

(52) U.S. Cl. ................... 333/238; 333/246; 333/34; 333/22 R

(58) Field of Classification Search ................ 333/246, 333/238, 22 R, 34
See application file for complete search history.

(56) References Cited

U.S. PATENT DOCUMENTS

2001/0017549 A1 * 8/2001 Inoue et al. ................ 324/754

2003/0030516 A1 2/2003 Tsukiyama et al.
2003/0077924 A1 4/2003 Shirasaki

FOREIGN PATENT DOCUMENTS

| EP | 0 942 470 | 9/1999 |
|---|---|---|
| JP | 3046287 | 5/2000 |
| JP | 2001-68596 | 3/2001 |
| JP | 2002-141435 | 5/2002 |
| JP | 2002-185201 | 6/2002 |

OTHER PUBLICATIONS

M. Ito et al., "Analysis of Millimeter-wave Packaging Structure Using Electromagnetic Simulator and Its Application to W-band Package", technical report of The Institute of Electronics, Information and Communication Engineers, ED2000-154, MW2000-107 (Sep. 2000), pp. 55-60.

* cited by examiner

Primary Examiner—Stephen E. Jones
(74) Attorney, Agent, or Firm—Wenderoth, Lind & Ponack, L.L.P.

(57) ABSTRACT

A high-frequency circuit formed on a surface of a dielectric substrate includes: a signal strip formed on a first face of the dielectric substrate for transmitting a signal therethrough; a pair of ground strips formed on the first face astride the signal strip, with an interspace on each side of the signal strip; a ground conductor layer formed on a second face of the dielectric substrate, the second face being opposite to the first face; and a plurality of through-vias formed in the dielectric substrate astride the signal strip for electrically connecting the pair of ground strips to the ground conductor layer. First and second through-vias, which are a pair of opposing through-vias located closest to a terminating end of the signal strip, are disposed apart from each other by a distance smaller than a distance between any other pair of opposing through-vias.

17 Claims, 11 Drawing Sheets

HIGH-FREQUENCY CIRCUIT AND HIGH-FREQUENCY PACKAGE

This application is a continuation of International Application PCT/JP03/15452, filed Dec. 3, 2003.

BACKGROUND OF THE INVENTION

1. Field of the Invention

The present invention relates to a high-frequency circuit which is applicable to a high-frequency module utilizing a radiofrequency in the microwave or millimeter range. More particularly, the present invention relates to a high-frequency circuit which effectively reduces radiation loss associated with a high-frequency signal.

2. Description of the Background Art

A rapid increase in the number of users of wireless devices in recent years underlines the need for an ability to utilize the millimeter range as a new frequency resource. There have been studies conducted to realize millimeter-range distance measuring devices in anti-collision radar for automobiles or the like, in an attempt to take advantage of the short wavelength of the millimeter range. However, before practical applications of millimeter range devices can be realized, the ability to mass-produce low cost and compact high-frequency circuitry will generally be required.

In order to enable mass-production of low cost and compact high-frequency circuitry, various high-frequency packages have been proposed. For example, a high-frequency package has been proposed in which a connection terminal is formed on a lower face of a package where a signal strip line has been taken out by utilizing a throughhole conductor or the like which penetrates a dielectric substrate, such that the package can be surface-mounted, by solder reflow technique, onto the wiring provided on an external circuit substrate.

FIG. 9A is a schematic cross-sectional view illustrating a conventional high-frequency package having been surface-mounted to an external circuit substrate. FIG. 9B is a view illustrating a wiring pattern of conductors formed on an upper face of a dielectric substrate 110. FIG. 9C is a view illustrating a wiring pattern of conductors formed on a lower face of the dielectric substrate 101.

In FIG. 9A, the high-frequency package comprises a high-frequency element 110, a dielectric substrate 101, and a cover 109. The high-frequency package is surface-mounted on an external circuit substrate 113. As shown in FIG. 9B, on the upper face of the dielectric substrate 101, a ground conductor layer 104, two signal strips 102a, and a ground conductor region 104b are formed. As shown in FIG. 9C, on the lower face of the dielectric substrate 101, two signal strips 102b, two ground strips 103 which are disposed so as to leave a predetermined space from the signal strips 102b, and a ground conductor region 104c are formed. The signal strips 102a, the ground conductor layer 104, and the ground conductor region 104c together constitute a grounded coplanar waveguide structure. The signal strips 102b, the ground strips 103, and the ground conductor layer 104 together constitute another grounded coplanar waveguide structure. As used herein, a "strip" refers to a wiring piece of conductor.

One end of each signal strip 102a is connected to the high-frequency element 110 via a wire 111. The wire 111 may be a ribbon or the like. The high-frequency element 111 may be mounted facedown, via conductor bumps. In other words, the high-frequency element 110 may be mounted through wireless bonding, e.g., flip chip mounting. The other end of each signal strip 102a is connected to one end of a corresponding signal strip 102b, by means of a through-via for connection purposes (hereinafter simply referred to as a "through-via") 112 which penetrates the dielectric substrate 101. Thus, a high-frequency signal which is output from the high-frequency element 110 or a high-frequency signal which is input to the high-frequency element 110 is transmitted via the wires 111, the signal strips 102a, the through-vias 112, and the signal strips 102b, without being grounded. Note that "through-via" is synonymous to "through conductor" for the purpose of the present specification.

On the upper face of the dielectric substrate 101, the ground conductor region 104b is disposed directly under the high-frequency element 110, so as to be electrically connected to the ground conductor layer 104. Via a plurality of through-vias 104d penetrating the dielectric substrate 101, the ground conductor region 104b is connected to the ground conductor region 104c formed on the lower face of the dielectric substrate 101. The ground conductor region 104c is electrically connected to the ground strip 103. Thus, a high-frequency ground is provided in the ground conductor region 104d. An arbitrary number of through-vias 116z are formed between the ground conductor layer 104 and the respective ground strips 103. The through-vias 116z electrically connect the ground strips 103 to the ground conductor layer 104, whereby a better high-frequency grounding ability is provided.

FIG. 10A is a view illustrating an exemplary wiring pattern of conductors formed on an upper face of the external circuit substrate 113. FIG. 10B is a view illustrating an exemplary wiring pattern of conductors formed on a lower face of the external circuit substrate 113.

The external circuit substrate 113 is a substrate on which the high-frequency package is to be surface-mounted. As shown in FIG. 10A, on the upper face of the external circuit substrate 113, two signal strips 114, two ground strips 116, and a ground conductor region 116b are formed. Interspaces are provided between each signal strip 114 and the ground strips 116. As shown in FIG. 10B, on the lower face of the external circuit substrate 113, a ground conductor layer 115 is formed.

Each signal strip 114 is electrically connected to a corresponding signal strip 102b via solder 117. Each ground strip 116 is electrically connected to a corresponding ground strip 103 via solder 117.

The ground conductor region 116b is disposed so as to come directly below the high-frequency element 110. The ground conductor region 116b is electrically connected to the ground conductor region 104c via solder 117. The ground conductor region 116b is connected to the ground conductor layer 115 by means of through-vias 116d penetrating the external circuit substrate 113. As a result, a high-frequency ground is provided in the ground conductor region 116b. An arbitrary number of through-vias 116 are formed between the ground conductor layer 115 and the respective ground strips 116. The through-vias 116 electrically connect the ground strips 116 to the ground conductor layer 115, whereby a better high-frequency grounding ability is provided.

Due to the aforementioned strip line structure, the external circuit substrate 113 functions as a grounded coplanar waveguide in which a high-frequency signal which is output from the high-frequency element 110 or a high-frequency signal which is input to the high-frequency element 110 can be transmitted without being grounded. Note that the ground conductor layer 115 may be provided inside the external circuit substrate 113. Further note that the external circuit substrate 113 will function as a microstrip line if the ground strips 116 are not provided.

Based on the above-described structure, which allows the high-frequency element 110 to be mechanically and electrically connected to the dielectric substrate 101, a compact high-frequency package is provided. Since signal strips are taken out on the lower face of the high-frequency package, it is easy to surface-mount the high-frequency package on the external circuit substrate. Thus, by employing the above-described high-frequency package, it is possible to provide low cost and compact high-frequency circuitry, with good mass producibility.

However, when the high-frequency package having the above structure is employed for transmitting a high-frequency signal, e.g., a signal in the millimeter range, losses may occur in various places. Therefore, the high-frequency package must be designed so as to minimize transmission loss of the high-frequency signal.

FIG. 11 is a cross-sectional view of the dielectric substrate 101 shown in FIGS. 9B and 9C, taken at line A-B. As shown in FIG. 11, the through-vias 116z are arranged in opposing rows astride the signal strips 102b. The ground strips 103, the ground conductor layer 104, the through-vias 116z, and the signal strips 102b together constitute a transmission line such as a grounded coplanar waveguide.

In a transmission line such as the grounded coplanar waveguide shown in FIG. 11, a waveguide surrounding the signal strips 102b is created by the ground strips 103, the ground conductor layer 104, and the through-vias 116z connecting therebetween. When such a waveguide is created, the high-frequency package must be designed so that transmission does not occur in a waveguide mode (i.e., a mode of transmission via the waveguide) at a frequency of the high-frequency signal to be transmitted. Otherwise, at each frequency of the high-frequency signal to be transmitted, the fundamental transmission mode (hereinafter simply referred to as the "transmission mode") will be converted to the waveguide mode, thereby resulting in transmission losses.

It is known that the waveguide mode can be suppressed by prescribing a distance W between a pair of opposing through-vias 116z to be half of an effective wavelength that corresponds to a designed frequency within the dielectric substrate 101. Assuming that the dielectric substrate 101 has a dielectric constant $\epsilon$, the effective wavelength of electromagnetic waves in the dielectric substrate 101 can be calculated by dividing a wavelength of the electromagnetic waves in a free space by $\epsilon^{1/2}$.

M, ITO et al., "Analysis of Millimeter-wave Packaging Structure Using Electromagnetic Simulator and Its Application to W-band Package", technical report of The Institute of Electronics, Information and Communication Engineers, ED2000-154 MW2000-107 (2000-09), pp.55–60 (hereinafter referred to as "Publication 1") shows an example design which takes waveguide mode suppression into consideration. In the example design described in Publication 1, a dielectric substrate having a dielectric constant of 7.5 is used, such that the distance between a pair of through-vias across a signal strip is 0.5 mm at the minimum. As illustrated in FIG. 6 of Publication 1, in the case where the design example of Publication 1 is used, deteriorations in the transmission characteristics occur in the neighborhood of 100 GHz to 120 GHz. The minimum opposing distance of 0.5 mm between a pair of through-vias is equivalent to half of the effective wavelength at a frequency of about 102 GHz. Publication 1 attributes such characteristics deteriorations to an increased loss due to a parasitic waveguide mode. In contrast, it can be seen that the transmission characteristics do not deteriorate in a frequency range up to about 90 GHz by using the opposing distance exemplified in Publication 1. Thus, from the description of Publication 1, it can be seen that the waveguide mode can be suppressed if the opposing distance W between each pair of through-vias is prescribed to be half of the effective wavelength corresponding to the designed frequency.

Moreover, radiation losses occurring at connections between signal strips and an external circuit substrate are also problems. At such connections, a high-frequency signal which has been transmitted in the fundamental mode inclines toward a parallel plane mode (which is a higher-order mode) due to an overlap between the ground conductor layer of the connection terminal and the ground conductor layer of the external circuit substrate, thus causing radiation loss.

Japanese Patent No. 3046287 (hereinafter referred to as "Publication 2") describes an exemplary method for reducing the aforementioned radiation loss. Specifically, Publication 2 proposes removing a portion of the conductor opposing the signal strips from part of the ground conductor layer of the connection terminal, to reduce radiation loss. Based on such a structure, the overlap between the ground conductor layer of the connection terminal and the ground conductor layer of the external circuit substrate is reduced, whereby the parallel plane mode is suppressed. As a result, a high-frequency package which can reduce radiation losses at connections can be realized.

Publication 1 also discloses an exemplary method of reducing radiation losses at connections. Publication 1 includes a detailed discussion of a parallel plane mode which is induced by an overlap between the ground conductor layer of the connection terminal and the ground conductor layer of the external circuit substrate. In Publication 1, at a connection boundary of the ground conductor layer of the connection terminal that lies closest to the substrate, a semicolumnar shaped connection conductor that penetrates through the end face is formed so that proper short-circuiting will occur all the way up to the ultrahigh-frequency band. By forming such a connection conductor that penetrates through the end face, the parallel plane mode is suppressed, whereby radiation loss can be reduced.

However, the above-described conventional techniques cannot attain complete elimination of transmission losses, and would present further problems in practice.

For example, the high-frequency package disclosed in Publication 2 has the problem of an increased module size. Downsizing is an essential requirement in any present-day high-frequency device; however, the high-frequency package disclosed in Publication 2 fails to satisfy this need. In the high-frequency package disclosed in Publication 2, a portion of the ground conductor layer formed closest to an end face of the dielectric substrate is removed. Such a partial removal of the ground conductor layer means that, in view of possible influences on the high-frequency transmission characteristics, it is undesirable to provide a cover, composed of a metal, ceramic, resin, or like materials, above the removed portion. For example, consider a case where a resin substrate is used as a dielectric substrate, under wiring process rules such that wiring can only be provided in portions at least 100 micrometers away from ends of the substrate and that the through-vias have a land diameter of 600 micrometers. Removing portions of the ground conductor layer between through-vias in this case would mean removing an area which is at least 700 micrometers long or more for each through-via existing at an end of the substrate. In this case, since one is prohibited from providing a cover over each of such areas which are 700 micrometers long or more, the size of the high-frequency package will have to be increased, given that the size of the MMIC to be mounted is no more than about one square millimeter. Therefore, the method described in Publication 2 cannot be adopted in whole.

The high-frequency package disclosed in Publication 1 has problems in terms of reliability and reproducibility because, when producing a high-frequency circuit by using a resin substrate or a high temperature-sintered ceramic substrate, etc., it would detract from reliability and reproducibility to form the through-vias in such a manner that the interior is exposed at the ends of the substrate.

SUMMARY OF THE INVENTION

Therefore, an object of the present invention is to provide a high-frequency circuit constructed on a dielectric substrate defining a high-frequency transmission line composed of a signal strip and ground strips, the high-frequency circuit having a wiring pattern such that, when the wiring substrate is connected to an external circuit substrate, the transmission loss of a high-frequency signal occurring at the connection can be reduced. The high-frequency circuit is shaped so as to require a minimum volumetric space, and can be provided without employing any special process.

In order to attain the object mentioned above, the inventor has found that the aforementioned transmission loss can be effectively reduced by decreasing the distance between a pair of opposing through-vias located closest to an end of the high-frequency transmission line, thereby accomplishing the present invention.

A first aspect of the present invention is directed to a high-frequency circuit formed on a surface of a dielectric substrate, comprising: a signal strip formed on a first face of the dielectric substrate for transmitting a signal therethrough; a pair of ground strips formed on the first face astride the signal strip, with an interspace on each side of the signal strip; a ground conductor layer formed on a second face of the dielectric substrate, the second face being opposite to the first face; and a plurality of through-vias formed in the dielectric substrate astride the signal strip for electrically connecting the pair of ground strips to the ground conductor layer, wherein, among the plurality of through-vias, first and second through-vias which are a pair of opposing through-vias located closest to a terminating end of the signal strip are disposed apart from each other by a distance smaller than a distance between any other pair of opposing through-vias.

In conventional techniques, the waveguide mode is suppressed in a periodic manner by disposing pairs of opposing through-vias with a constant period, the distance between each pair of opposing through-vias being half of the effective wavelength corresponding to the designed frequency. However, in those conventional techniques, periodicity is broken at the terminating end of the grounded coplanar waveguide structure, such that the waveguide mode suppressing effect provided by the opposing through-vias is weakened, and the transmission loss due to the waveguide mode is increased. Specifically, in a region lying closer to the substrate end than an imaginary line connecting the centers of the pair of through-vias provided at the terminating end, the distance between the through-vias defining side walls of the waveguide gradually increases, thus gradually lowering the cutoff frequency for the waveguide mode to and resulting in an increased transmission loss.

According to the first aspect of the present invention, the distance between a pair of opposing through-vias at the terminating end of the grounded coplanar waveguide is less than a distance required for suppressing the waveguide mode at the transmission frequency. Therefore, the cutoff frequency can be prevented from lowering even in the region lying closer to the substrate end than an imaginary line connecting the centers of the pair of through-vias provided at the terminating end. Thus, a high-frequency circuit which can minimize an increase in the transmission loss can be provided. The high-frequency circuit according to the present invention also has an advantage in that the circuit scale is not increased as compared to the circuit scale used in the conventional techniques.

Moreover, according to the first aspect of the present invention, the distance between the pair of opposing through-vias provided at the terminating end is reduced, whereby the grounding ability of the ground conductor layer formed on the second face of the dielectric substrate is improved. Therefore, it becomes easier to maintain grounding characteristics such that proper short-circuiting will occur all the way up to the ultrahigh-frequency band even at the connection boundary (lying closest to the substrate end) of a ground conductor layer on an external circuit substrate. As a result, the parallel plane mode is suppressed, whereby the radiation loss can be reduced. The high-frequency circuit according to the present invention also has an advantage in that it can be produced without employing any special process beyond conventional techniques, and can be produced by employing a commonly-used set of process rules.

For example, the distance between the first and second through-vias may be less than ½ of an effective wavelength corresponding to a designed frequency, and the distance between any other pair of opposing through-vias may be equal to or less than ½ of the effective wavelength corresponding to the designed frequency.

Preferably, the terminating end of the signal strip is near an end of the dielectric substrate, and the first and second through-vias are disposed so that a distance between portions thereof that lie closest to the end of the dielectric substrate is less than ½ of the effective wavelength corresponding to the designed frequency.

Thus, the pair of through-vias at the terminating end are disposed so that a distance between portions thereof that lie closest to an end of the dielectric substrate is less than ½ of the effective wavelength corresponding to the designed frequency. As a result, the waveguide mode can be suppressed more effectively.

Preferably, the first and second through-vias are each disposed so as to be away from an end of the ground conductor layer by a distance which is less than ¼ of the effective wavelength corresponding to the designed frequency.

Thus, the radiation loss can be further reduced. Conversely, if the first and second through-vias provided at the terminating end of the signal strip were placed in a region away from the terminating end of the ground conductor layer by a distance which is equal to or greater than ¼ of the effective wavelength corresponding to the designed frequency, a higher-mode resonance would occur at a frequency whose ¼ wavelength is equal to the effective distance from the pair of through-vias closest to the substrate end to the end of the ground conductor layer, thus increasing the radiation loss in a frequency range near the resonance frequency. However, according to the above-described embodiment of the present invention, the first and second through-vias are each disposed so as to be away from the end of the ground conductor layer by a distance which is less than ¼ of the effective wavelength. As a result, the higher-mode resonance can be prevented, thereby reducing the radiation loss in a frequency range near the resonance frequency. The present invention is advantageous over the conventional techniques not only because the present invention provides a solution based on a circuit structure which requires a less volumetric space, but also because no special processes are required during manufacture according to the present invention.

Preferably, the signal strip is narrower at the terminating end than at any other portion.

Thus, signal transmission with subdued reflections is enabled. Traditionally, in order to surface-mount a high-frequency package, it would be necessary to connect the signal strip on the dielectric substrate of the high-frequency package to a signal strip on an external circuit substrate, and connect the ground strip on the dielectric substrate to a ground strip on the external circuit substrate, i.e., the two coplanar waveguides must be interconnected. However, as a result of this, the capacitance existing between signal strip and the ground conductor layer opposing the signal strip will exert a substantial influence over the device characteristics, because the transmission mode of the high-frequency transmission line behaves in a microstrip-line fashion everywhere but the terminating end of the high-frequency transmission line. Therefore, according to the above-described embodiment of the present invention, the width of the signal strip is narrowed at the terminating end of the high-frequency transmission line, so that the capacitance existing between signal strip and the ground conductor layer is decreased, and conversely, the capacitance existing between the signal strip and the ground strips on both sides of the signal strip is increased. As a result, a smooth transmission mode transition can occur, thus enabling signal transmission with subdued reflections. The present invention is advantageous over the conventional techniques not only because the present invention provides a solution based on a circuit structure which requires a less volumetric space, but also because no special processes are required during manufacture according to the present invention.

Preferably, an interspace between the signal strip and each ground strip is narrower at the terminating end of the signal strip than at any other portion.

Thus, the capacitance existing between the signal strip and the ground strips on both sides of the signal strip is increased, so that a smooth transmission mode transition can occur, thus enabling signal transmission with subdued reflections. The present invention is advantageous over the conventional techniques not only because the present invention provides a solution based on a circuit structure which requires a less volumetric space, but also because no special processes are required during manufacture according to the present invention.

Preferably, the dielectric substrate is a resin substrate having a low dielectric constant.

Thus, the effect according to the present invention can be maximized. It is common practice to use a resin substrate or a ceramic substrate as the dielectric substrate. However, the higher dielectric constant the material composing the dielectric substrate has, the shorter the effective wavelength within the dielectric substrate becomes. Employing a dielectric substrate having a high dielectric constant would require a high precision in the wiring pattern formation, possibly causing characteristic fluctuations due to manufactural fluctuations. Therefore, according to the above-described embodiment of the present invention, a dielectric substrate having a low dielectric constant is used, thereby reducing the characteristic fluctuations and making it possible to obtain the expected effects. The present invention is advantageous over the conventional techniques not only because the present invention provides a solution based on a circuit structure which requires a less volumetric space, but also because no special processes are required during manufacture according to the present invention.

Preferably, portions of the ground conductor layer interposed between the first and the second through-via and opposing the signal strip are eliminated. Alternatively, within a region extending nearer to an end of the substrate than to a region interposed between the first and second through-vias, portions of the ground conductor layer opposing the signal strip are eliminated. Alternatively, portions of the ground conductor layer opposing the signal strip are removed.

Thus, the parallel plane mode is suppressed, and the radiation loss can be reduced. The present invention requires no special processes during manufacture over conventional techniques. A particularly useful embodiment is the embodiment in which, within a region extending nearer to an end of the substrate than to a region interposed between the first and second through-vias, portions of the ground conductor layer opposing the signal strip are removed. The reason is that this makes it possible to place a cover over the first and second through-vias, which in itself is advantageous in terms of downsizing the high-frequency package.

A second aspect of the present invention is directed to a high-frequency package into which an integrated circuit is packaged, comprising: a high-frequency element composed of the integrated circuit for processing a high-frequency signal; and a dielectric substrate on which the high-frequency element is mounted, wherein the dielectric substrate includes: a signal strip formed on a first face of the dielectric substrate for transmitting a signal therethrough; a pair of ground strips formed on the first face astride the signal strip, with an interspace on each side of the signal strip; a ground conductor layer formed on a second face of the dielectric substrate, the second face being opposite to the first face; and a plurality of through-vias formed in the dielectric substrate astride the signal strip for electrically connecting the pair of ground strips to the ground conductor layer, wherein, among the plurality of through-vias, first and second through-vias which are a pair of opposing through-vias located closest to a terminating end of the signal strip are disposed apart from each other by a distance smaller than a distance between any other pair of opposing through-vias.

For example, the distance between the first and second through-vias may be less than ½ of an effective wavelength corresponding to a designed frequency, and the distance between any other pair of opposing through-vias may be equal to or less than ½ of the effective wavelength corresponding to the designed frequency.

Preferably, the terminating end of the signal strip is near an end of the dielectric substrate, and the first and second through-vias are disposed so that a distance between portions thereof that lie closest to the end of the dielectric substrate is less than ½ of the effective wavelength corresponding to the designed frequency.

The high-frequency package may further comprise a mounting-side dielectric substrate on which the dielectric substrate is mounted, wherein the mounting-side dielectric substrate includes: a mounting-side signal strip formed on a first mounting face of the mounting-side dielectric substrate so as to be connected to the signal strip for transmitting the signal therethrough; a pair of mounting-side ground strips formed on the first mounting face astride the mounting-side signal strip, with an interspace on each side of the mounting-side signal strip; a mounting-side ground conductor layer formed on a second mounting face of the mounting-side dielectric substrate, the second mounting face being opposite to the first mounting face; and a plurality of mounting-side through-vias formed in the mounting-side dielectric substrate astride the mounting-side signal strip for electrically connecting the pair of mounting-side ground strips to the mounting-side ground conductor layer, wherein, among the plurality of mounting-side through-vias, first and second mounting-side through-vias which are a pair of opposing mounting-side through-vias located closest to a terminating end of the mounting-side signal strip are disposed apart from each other by a distance smaller than a distance between any other pair of opposing mounting-side through-vias.

For example, the distance between the first and second mounting-side through-vias may be less than ½ of an effective wavelength corresponding to a designed frequency, and the distance between any other pair of opposing mounting-side through-vias may be equal to or less than ½ of the effective wavelength corresponding to the designed frequency.

Preferably, the terminating end of the mounting-side signal strip is near an end of the mounting-side dielectric substrate, and the first and second mounting-side through-vias are disposed so that a distance between portions thereof that lie closest to the end of the mounting-side dielectric substrate is less than ½ of the effective wavelength corresponding to the designed frequency.

Preferably, the high-frequency package further comprises a cover for protecting the high-frequency element.

A third aspect of the present invention is directed to a high-frequency circuit formed on a surface of a dielectric substrate on which a high-frequency package is to be surface-mounted, the high-frequency package having a coplanar waveguide formed on a lower face thereof, comprising: a signal strip formed on a first face of the dielectric substrate so as to be connected to the high-frequency package for transmitting a signal therethrough; a pair of ground strips formed on the first face astride the signal strip, with an interspace on each side of the signal strip; a ground conductor layer formed on a second face of the dielectric substrate, the second face being opposite to the first face; and a plurality of through-vias formed in the dielectric substrate astride the signal strip for electrically connecting the pair of ground strips to the ground conductor layer, wherein, among the plurality of through-vias, first and second through-vias which are a pair of opposing through-vias located closest to a terminating end of the signal strip are disposed apart from each other by a distance smaller than a distance between any other pair of opposing through-vias.

For example, the distance between the first and second through-vias may be less than ½ of an effective wavelength corresponding to a designed frequency, and the distance between any other pair of opposing through-vias may be equal to or less than ½ of the effective wavelength corresponding to the designed frequency.

Preferably, the terminating end of the signal strip is near an end of the dielectric substrate, and the first and second through-vias are disposed so that a distance between portions thereof that lie closest to the end of the dielectric substrate is less than ½ of the effective wavelength corresponding to the designed frequency.

According to the second and third aspects of the present invention, the waveguide mode and the parallel plane mode during a high-frequency signal transmission can be suppressed, whereby the radiation loss can be reduced, thus providing a practical advantage. The present invention not only provides a solution based on a circuit structure which requires a less volumetric space, but also requires no special processes during manufacture.

In the high-frequency circuit according to the present invention, the through-via may be shaped as a circular column, a rectangular column, a triangular column, or a hexagonal column. For example, in the case where the through-via is a rectangular column, a triangular column, or a hexagonal column, an excellent reduction in radiation loss can be obtained by disposing the first and second through-vias so that portions thereof that lie closest to an end of the dielectric substrate are apart by a distance which is shorter than that between any other pair of opposing through-vias.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1A:
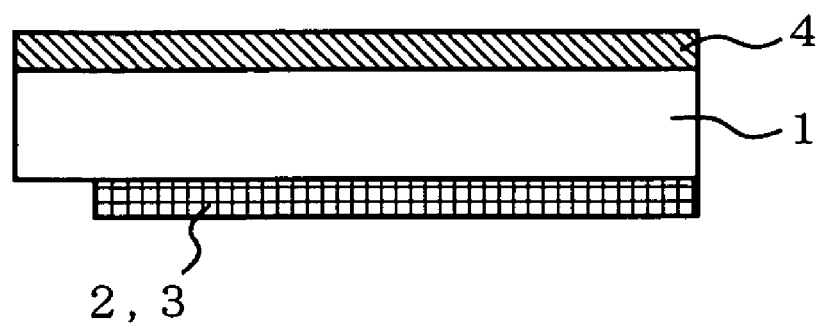
FIG. 1A is a schematic cross-sectional view illustrating the structure of a high-frequency circuit according to a first embodiment of the present invention.
Figure 1B:
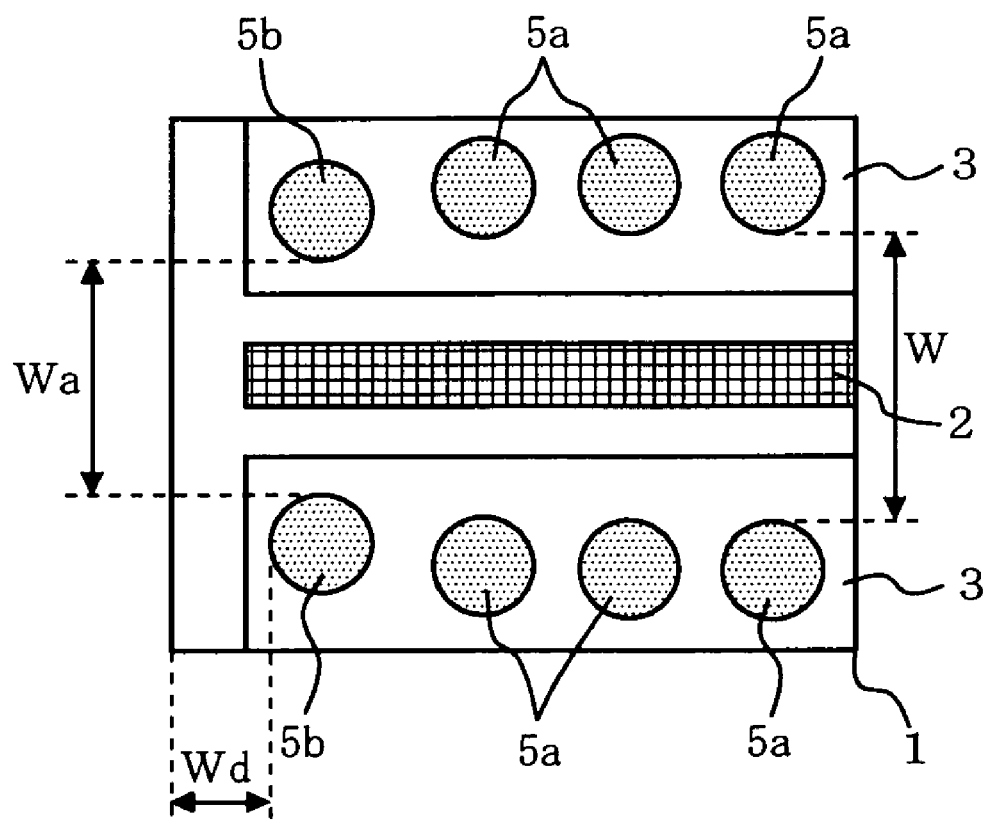
FIG. 1B is a plan view showing a wiring pattern on a lower face of the high-frequency circuit shown in FIG. 1A.

FIG. 1A is a schematic cross-sectional view illustrating the structure of a high-frequency circuit according to a first embodiment of the present invention. FIG. 1B is a plan view showing a wiring pattern on a lower face of the high-frequency circuit shown in FIG. 1A.

In FIGS. 1A and 1B, the high-frequency circuit according to the first embodiment includes a dielectric substrate 1, a signal strip 2, two ground strips 3, aground conductor layer 4, a plurality of through-vias 5a, and two through-vias 5b. The signal strip 2 and the ground strips 3 are formed on a lower face (which may conveniently be referred to as the "first face") of the dielectric substrate 1. The ground conductor layer 4 is formed on an upper face (which may conveniently be referred to as the "second face") of the dielectric substrate 1.

The signal strip 2 is formed in a middle portion of the lower face of the dielectric substrate 1. The two ground strips 3 are formed on the lower face of the dielectric substrate 1 so as to be parallel to each other, with an arbitrary interspace being left between the signal strip 2 and the ground strips 3. The ground conductor layer 4 is formed on the upper face of the dielectric substrate 3 so as to extend parallel to the signal strip 2 and the ground strips 3. Based on an electromagnetic field distribution between the signal strip 2 and each ground conductor, the transmission characteristics of the grounded coplanar waveguide structure are determined.

The through-vias 5a and 5b are formed so as to extend from the upper face, through to the lower face of the dielectric substrate 1. Each of the through-vias 5a and 5b may be composed of, for example, a plating or the like provided on an inner wall which is created by drilling a hole in the dielectric substrate 1. The through-vias 5a and 5b electrically connect the ground strips 3 to the ground conductor layer 4.

An opposing distance W between through-vias 5a straddling the signal strip 2 is equal to or less than ½ of an effective wavelength corresponding to a designed frequency within the dielectric substrate 1. As used herein, the "designed frequency" is defined as an upper limit frequency value of the frequency range of a high-frequency signal to be transmitted through the signal strip 2. For example, in the case where an active device such as a high-frequency element is connected to the signal strip 2, a high-frequency signal will be input to or output from the active device by being transmitted through the signal strip 2; in this case, the upper limit frequency value of the frequency range of the high-frequency signal to be input to or output from the active device is the "designed frequency". An effective wavelength of the electromagnetic waves in the dielectric substrate 101, assuming that the dielectric substrate 101 has a dielectric constant $\epsilon$, can be calculated by dividing a wavelength of the electromagnetic waves in a free space by $\epsilon^{1/2}$. By prescribing the opposing distance W between through-vias 5a to be equal to or less than ½ of the effective wavelength corresponding to the designed frequency within the dielectric substrate 1, the waveguide mode can be suppressed. For example, in the case where a liquid crystal polymer having a dielectric constant of 3 is used for the dielectric substrate 1, if the minimum distance between opposing through-vias 5a is 1000 micrometers, the cutoff frequency for the waveguide mode in the transmission line structure is about 85 GHz. Therefore, in order to transmit a signal in a frequency range of 85 GHz or less, the waveguide mode can be suppressed and hence the transmission loss can be reduced by prescribing the opposing distance W between through-vias 5a to be 1000 micrometers.

An essential point in the present invention is that an opposing distance Wa between the pair of through-vias 5b that are located the closest to a terminating end (shown as the leftmost end in FIG. 1B) of the signal strip 2 is prescribed to be shorter than a distance which is required to ensure substantial elimination of the waveguide mode in the transmission line structure. Note that the opposing distance Wa is to be measured between the inner edges of the through-vias 5b, across the signal strip 2.

Figure 2A:
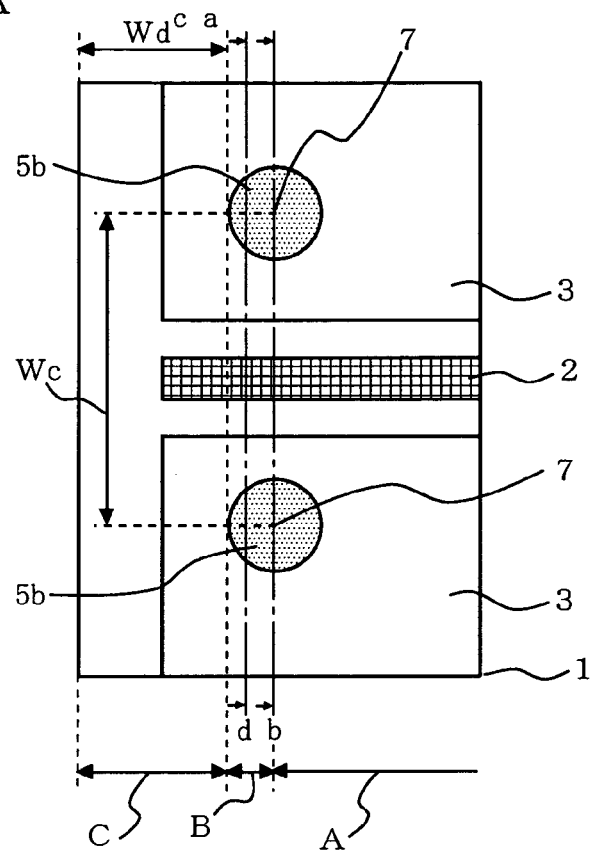
FIG. 2A is an enlarged view showing a wiring pattern on a lower face of a dielectric substrate.
Figure 2B:
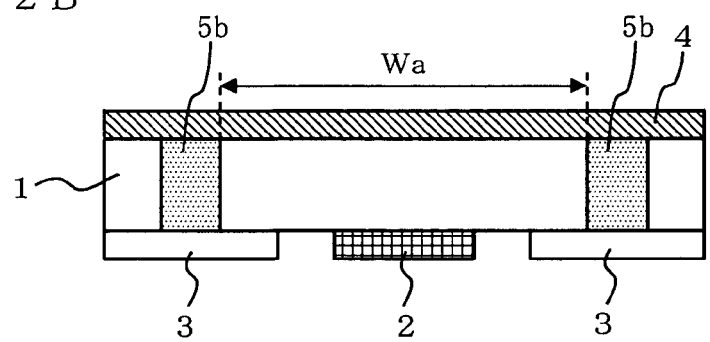
FIG. 2B is a cross-sectional view illustrating the dielectric substrate 1 shown in FIG. 2A, taken at line a-b.
Figure 2C:
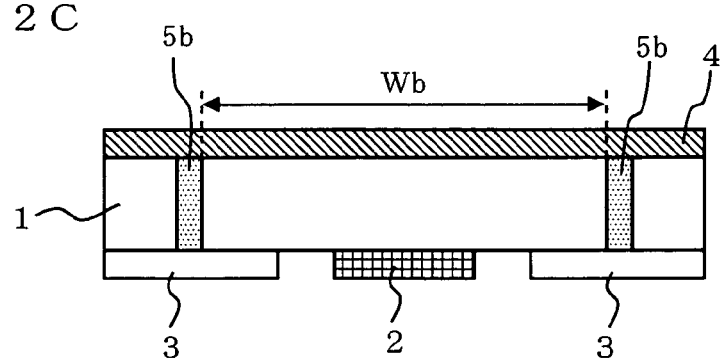
FIG. 2C is a cross-sectional view illustrating the dielectric substrate 1 shown in FIG. 2A, taken at line c-d.

Hereinafter, referring to FIGS. 2A, 2B, and 2C, the role which the pair of through-vias ("first and second through-vias") 5b, straddling the signal strip 2 and being formed close to the terminating end of the signal strip 2, plays in the high-frequency circuit according to the present invention will be specifically described. FIG. 2A is an enlarged view showing a wiring pattern on a lower face of the dielectric substrate 1. FIG. 2B is a cross-sectional view illustrating the dielectric substrate 1 shown in FIG. 2A, taken at line a-b. FIG. 2C is a cross-sectional view illustrating the dielectric substrate 1 shown in FIG. 2A, taken at line c-d.

In FIG. 2A, the high-frequency circuit has a high-frequency transmission line structure which can be divided into three regions A, B, and C, which are defined as follows. Region A is an area which extends from an imaginary line connecting the centers 7 of the pair of through-vias 5b toward the center of the substrate. Region B is an area which extends between the imaginary line connecting the centers 7 of the pair of through-vias 5b and an imaginary line connecting "far ends" of the through-vias 5b, i.e., portions that lie closest to an end of the substrate (away from the center of the substrate). Region C is an area in which the signal strip 2 is no longer interposed between the through-vias 5b.

In region A, an arbitrary number of through-vias 5a are periodically formed away from the through-vias 5b, toward the center of the substrate (see FIG. 1B). Therefore, region A can be considered as an ideal transmission line for suppressing the waveguide mode in a periodic manner with respect to the direction of transmission. Then, in terms of the entire transmission line, the cutoff frequency for the waveguide mode will depend upon the minimum opposing distance Wa between the pair of through-vias 5b that functions to suppress the waveguide mode at a position closest to an end of the substrate.

In region B, if the through-vias 5b are of a commonly-used columnar shape, the opposing distance Wb between the pair of through-vias 5b gradually increases toward the end of the substrate, until finally reaching Wc. The cutoff frequency for the waveguide mode decreases as the opposing distance Wb increases. Therefore, in order to reduce the radiation loss over the entire transmission line, it is necessary to minimize the radiation loss in region B by suppressing the waveguide mode in region B.

According to the present invention, in order to suppress the waveguide mode in region B, the opposing distance Wa between the pair of through-vias 5b is prescribed to be shorter than the opposing distance W between any pair of through-vias 5a which is required for eliminating the waveguide mode in region A.

Specifically, in the first embodiment, the opposing distance Wa between the pair of through-vias 5b is prescribed to be less than ½ of the effective wavelength corresponding to the designed frequency. As a result, the waveguide mode is suppressed even in region B, thereby reducing the radiation loss over the entire transmission line.

Due to the relatively short opposing distance between the pair of through-vias 5b formed at a terminating end of the signal strip, the grounding ability of the ground conductor layer 4 (which is formed on upper face on the dielectric substrate 1) is improved. Therefore, proper short-circuiting will occur all the way up to the ultrahigh-frequency band at a connection boundary between the dielectric substrate 1 and the external circuit substrate. This makes it possible to suppress the parallel plane mode induced by an overlap between the ground conductor layer 4 and a ground conductor layer (see the ground conductor layer 15 in FIG. 6A, described later) which is formed on a side of the external circuit substrate opposing the signal strip 2 on the lower face of the dielectric substrate 1, whereby the radiation loss can be reduced.

Since it is unnecessary to form the ground conductor layer 4 on the upper face of the dielectric substrate 1 into any special shape, there is no need for an extra circuit area. As a result, it is possible to maintain a circuit structure which requires a minimum volumetric space while reducing the radiation loss. Since no pair of through-vias 5b is partially exposed at an end face of the dielectric substrate 1, it is possible to reduce the radiation loss without employing any special process, thus providing a practical advantage.

In the above embodiment, the distance Wa between the pair of opposing through-vias 5b is prescribed to be less than ½ of the effective wavelength corresponding to the designed frequency. More preferably, the through-vias 5b are disposed so that the opposing distance Wc between portions thereof that lie closest to an end of the substrate (i.e., the points defining an imaginary border line between regions B and C) is less than ½ of the effective wavelength corresponding to the designed frequency. As a result, suppression of the waveguide mode can be attained anywhere in region B, so that a more effective reduction in radiation loss can be attained. In order to prescribe the distance Wc between portions of the opposing through-vias 5b that lie closest to an end of the substrate to be less than ½ of the effective wavelength corresponding to the designed frequency, the pair of opposing through-vias 5b may simply be brought closer to each other. Alternatively, each through-via 5b may be shaped as a right-angled prism such that one side thereof extends in parallel to the end of the substrate.

As described above, the designed frequency is defined as an upper limit frequency value of the frequency range of a high-frequency signal to be transmitted through the signal strip 2 in the present embodiment. Alternatively, the designed frequency may be defined to be twice the upper limit frequency value of the frequency range of a high-frequency signal to be transmitted through the signal strip 2.

As a result, it becomes possible to suppress the waveguide mode also with respect to the second harmonic, thus further reducing the radiation loss.

It is most preferable that the through-vias 5b are disposed so that a distance Wd (i.e., the lateral length of region C as shown in FIG. 1B) between the terminating end of the ground conductor layer 4 and the portion of the through-via 5b that lies closest to an end of the substrate is less than ¼ of the effective wavelength corresponding to the designed frequency within the dielectric substrate 1, in order to achieve a good reduction of radiation loss. If the through-via 5b is formed at a position which is ¼ of the effective wavelength or more away from the terminating end of the ground conductor layer 4, a higher-mode resonance with a frequency corresponding to ¼ of the effective wavelength will occur in the portion between the through-via 5b and the terminating end of the ground conductor layer, resulting in an increased radiation loss in a frequency range near the resonance frequency.

Although the present embodiment illustrates an example where the through-via has a columnar shape, the through-via may be shaped as a rectangular column, a triangular column, or a hexagonal column, for example.

Although the dielectric substrate is illustrated as having a "lower face" on which the signal strips and the ground strips are formed and an "upper face" on which the ground conductor layer is formed, the lower and upper faces may be reversed.

The dielectric substrate may advantageously be a resin substrate having a low dielectric constant. Generally speaking, a resin substrate, a ceramic substrate, or the like is usable as a dielectric substrate. Note that the effective wavelength within the dielectric substrate will decrease as the dielectric constant of the material of the dielectric substrate increases. Therefore, employing a dielectric substrate having a high dielectric constant will require a high precision in the formation of wiring patterns, possibly causing characteristic fluctuations due to manufactural fluctuations. Therefore, by employing a low-dielectric constant dielectric substrate, e.g., having a dielectric constant of 5.0 or less, the characteristic fluctuations can be reduced, thereby facilitating the obtainment of the desired effects. The present invention is advantageous over the conventional techniques not only because the present invention provides a solution based on a circuit structure which requires a less volumetric space, but also because it requires no special processes during manufacture.

(Second Embodiment)

Figure 3:
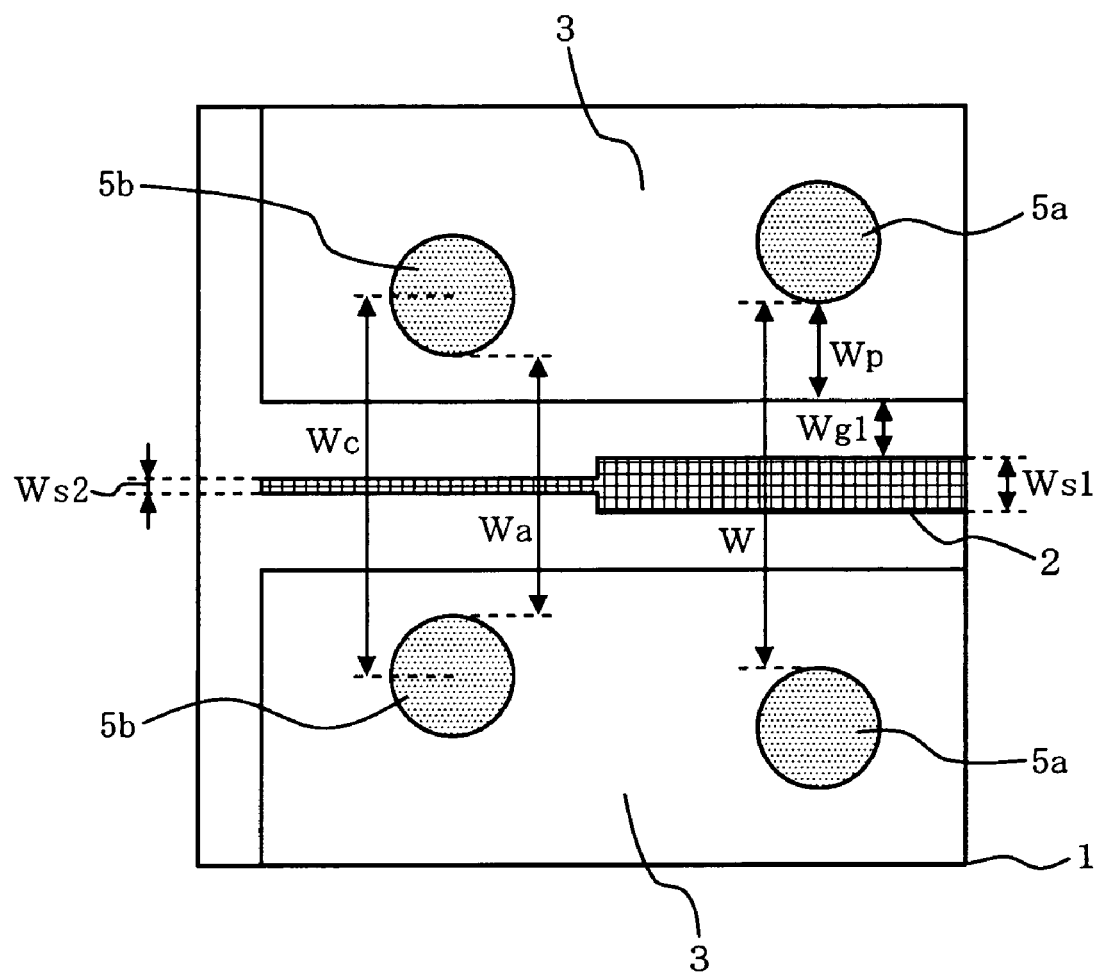
FIG. 3 is an enlarged view showing a wiring pattern on a high-frequency circuit according to a second embodiment of the present invention.

FIG. 3 is an enlarged view showing a wiring pattern on a high-frequency circuit according to a second embodiment of the present invention. In FIG. 3, those elements which have their counterparts in the first embodiment are denoted by the same reference numerals as those used therein. As shown in FIG. 3, a width Ws2 of the signal strip 2 at its terminating end is smaller than a width Ws1 thereof at any point other than the terminating end.

By thus reducing the width Ws2 of the signal strip 2 at its terminating end, the capacitance between the ground conductor layer 4 and the signal strip 2 can be reduced, relative to which the capacitance between the signal strip 2 and the ground strips 3 will appear large. As a result, a smooth transition from a microstrip line-based transmission mode to a coplanar waveguide-based transmission mode occurs, thus reducing reflections of the high-frequency signal to be transmitted.

The present embodiment will be particularly useful in the following case, for example. As can be seen from FIG. 3, W=2×Wp+2×Wg1+Ws1. Similarly, the distance Wa (or Wc) between the pair of opposing through-vias 5b is defined by the width of the signal strip 2, the interspace between the signal strip 2 and either ground strip 3, and the shortest distance from the ground strip 3 to the surface of each through-via. Thus, the actual prescription of the value of the opposing distance Wa (or Wc) must be made in compliance with the particular process rules adopted. For example, some process rules impose limitations on the values of Wg1 and Wp; in this case, the desired Wa (or Wc) value may be obtained not by adjusting Wg1 or Wp, but by adjusting Ws (hence the reduced width Ws2 of the signal strip 2 at the terminating end). Thus, according to the second embodiment, a high-frequency circuit with a reduced radiation loss and subdued reflections can be provided even in the case where the adopted process rules impose limitations on Wg1 or Wp.

(Third Embodiment)

Figure 4:
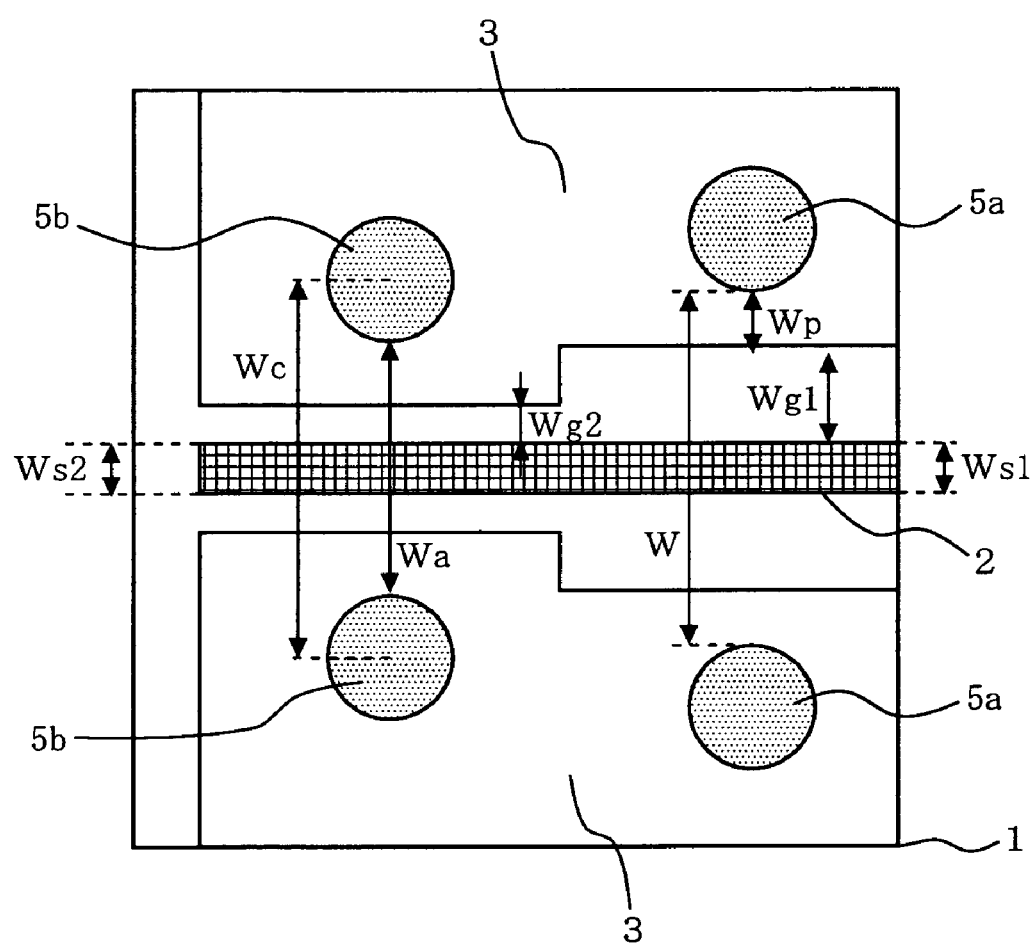
FIG. 4 is an enlarged view showing a wiring pattern on a high-frequency circuit according to a third embodiment of the present invention.

FIG. 4 is an enlarged view showing a wiring pattern on a high-frequency circuit according to a third embodiment of the present invention. In FIG. 4, those elements which have their counterparts in the first embodiment are denoted by the same reference numerals as those used therein. As shown in FIG. 4, an interspace Wg2 between the signal strip 2 and either ground strip 3 is smaller at the terminating end of the signal strip 2 than an interspace Wg1 at any point other than the terminating end.

By thus reducing the interspace Wg2 between the signal strip 2 and either ground strip 3 at the terminating end of the signal strip 2, the capacitance between the signal strip 2 and the ground strips 3 can be increased, relative to which the capacitance between the ground conductor layer 4 and the signal strip 2 will appear small. As a result, a smooth transition from a microstrip line-based transmission mode to a coplanar waveguide-based transmission mode occurs, thus reducing reflections of the high-frequency signal to be transmitted.

The present embodiment will be particularly useful in the following case, for example. As can be seen from FIG. 4, W=2×Wp+2×Wg1+Ws1. Similarly, the distance Wa (or Wc) between the pair of opposing through-vias 5b is defined by the width of the signal strip 2, the interspace between the signal strip 2 and either ground strip 3, and the shortest distance from the edge of either ground strip 3 to the surface of each through-via. Thus, the actual prescription of the value of the opposing distance Wa (or Wc) must be made in compliance with the particular process rules adopted. For example, some process rules impose limitations on the values of Wp and Ws1; in this case, the desired Wa (or Wc) value may be obtained not by adjusting Wp or Ws1, but by adjusting Wg (hence the reduced interspace Wg2 at the terminating end of the signal strip 2). Thus, according to the third embodiment, a high-frequency circuit with a reduced radiation loss and subdued reflections can be provided even in the case where the adopted process rules impose limitations on Wp or Ws1.

(Fourth Embodiment)

Figure 5A:
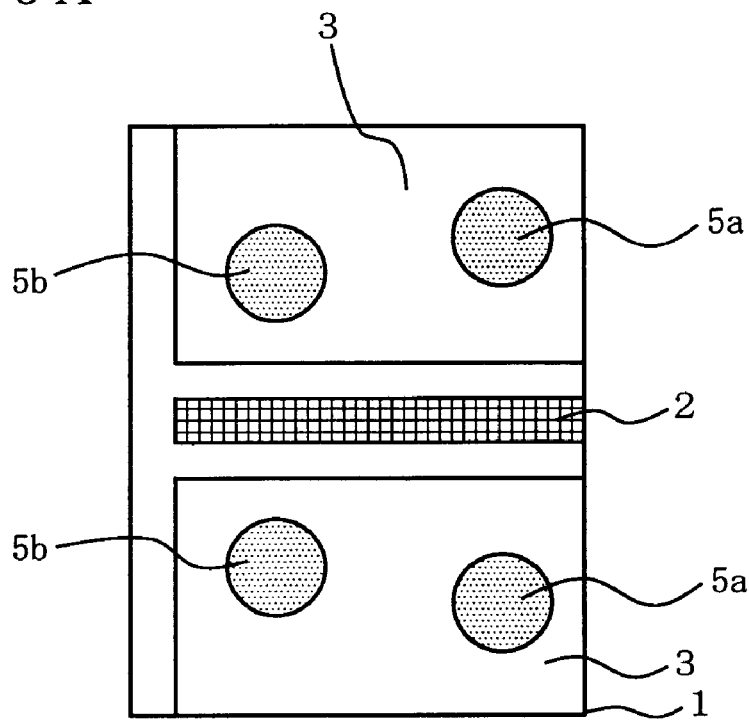
FIG. 5A is an enlarged view showing a wiring pattern on a lower face of a dielectric substrate 1 according to a fourth embodiment of the present invention.
Figure 5B:
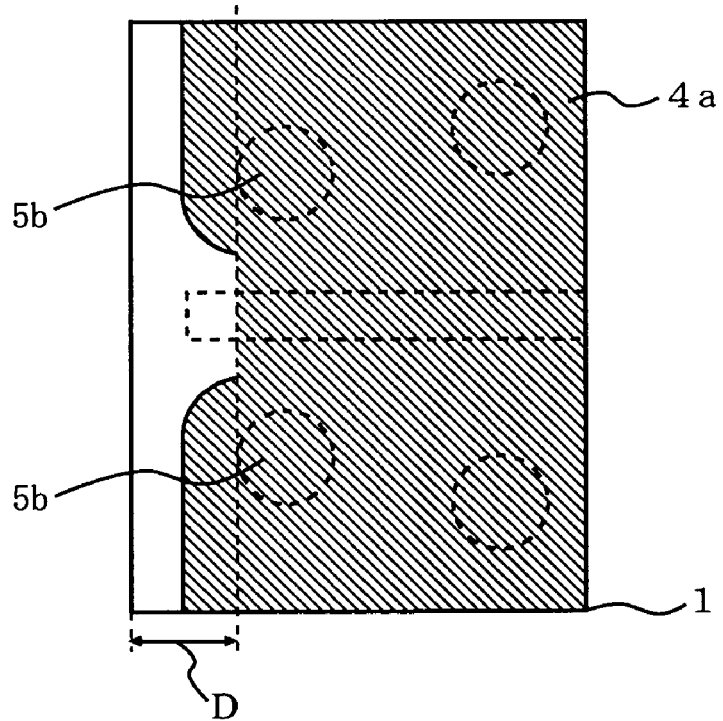
FIG. 5B is an enlarged view showing a wiring pattern on an upper face of the dielectric substrate 1 shown in FIG. 5A.

FIGS. 5A and 5B are enlarged views each showing a wiring pattern of a high-frequency circuit according to a fourth embodiment of the present invention. In FIGS. 5A and 5B, those elements which have their counterparts in the first embodiment are denoted by the same reference numerals as those used therein. FIG. 5A shows a wiring pattern on a lower face of the dielectric substrate 1, and FIG. 5B shows a wiring pattern on an upper face of the dielectric substrate 1.

As shown in FIG. 5A, the wiring pattern on the lower face of the dielectric substrate 1 is similar to that in the first embodiment. On the other hand, as shown in FIG. 5B, the wiring pattern on the upper face of the dielectric substrate 1 is different from that in the first embodiment with respect the ground conductor layer 4a.

As shown in FIG. 5B, portions of the ground conductor layer 4a opposing the terminating end of the signal strip 2 are removed. Specifically, within region D extending from an imaginary line connecting "far ends" of the through-vias 5b, i.e., portions that lie closest to an end of the substrate (away from the center of the substrate) toward an end of the dielectric substrate 1 (shown as the leftmost end in FIG. 5B), those portions opposing the signal strip 2 are removed. As a result, the parallel plane mode is suppressed, whereby the radiation loss can be reduced.

Alternatively, the portions of the ground conductor layer 4 to be removed may be portions interposed between the pair of through-vias 5b and opposing the signal strip 2. In this case, the parallel plane mode will be suppressed, whereby the radiation loss can be reduced.

Although the present embodiment illustrates an example where the wiring pattern according to the first embodiment is employed, it will be appreciated that a wiring pattern according to the second or third embodiment may instead be employed.

(Fifth Embodiment)

Figure 6A:
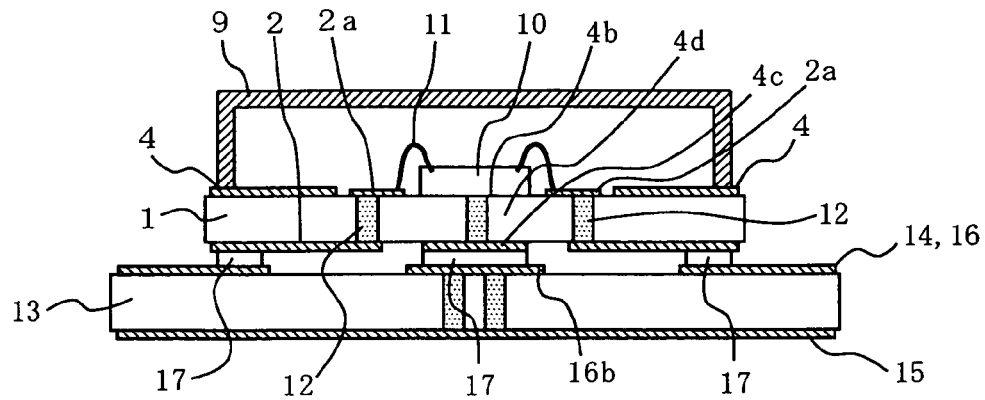
FIG. 6A is a schematic cross-sectional view illustrating a high-frequency package according to a fifth embodiment of the present invention having been surface-mounted on an external circuit substrate.
Figure 6B:
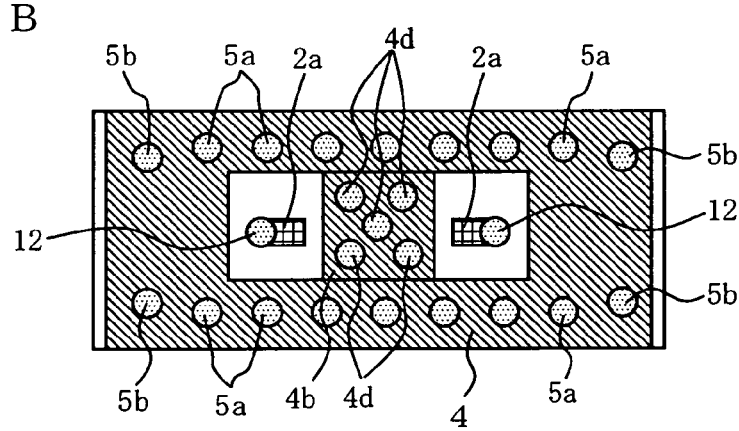
FIG. 6B is a view illustrating a wiring pattern of conductors formed on an upper face of a dielectric substrate 1 shown in FIG. 6A.
Figure 6C:
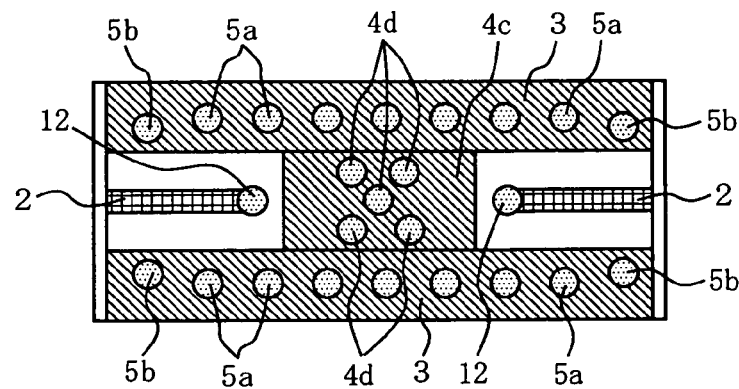
FIG. 6C is a view illustrating a wiring pattern of conductors formed on a lower face of the dielectric substrate 1 shown in FIG. 6A.

FIGS. 6A, 6B, and 6C are views illustrating a high-frequency package according to a fifth embodiment of the present invention having been surface-mounted on an external circuit substrate FIG. 6A is a schematic cross-sectional view; FIG. 6B is a view illustrating a wiring pattern of conductors formed on an upper face of a dielectric substrate 1 shown in FIG. 6A; and FIG. 6C is a view illustrating a wiring pattern of conductors formed on a lower face of the dielectric substrate 1 shown in FIG. 6A. In FIGS. 6A, 6B, and 6C, those elements which have their counterparts in the first embodiment are denoted by the same reference numerals as those used therein.

As used herein, a "high-frequency package" at least comprises: a high-frequency circuit constructed on a dielectric substrate; and a high-frequency element (which in itself is composed of an integrated circuit) mounted on the high-frequency circuit.

In FIG. 6A, the high-frequency package comprises a high-frequency element 10 which comprises an integrated circuit for processing a high-frequency signal, a dielectric substrate 1, and a cover 9. The high-frequency package is surface-mounted on an external circuit substrate 13, which is composed of a dielectric material. As such, the external circuit substrate 13 may hereinafter be referred to as a "mounting-side dielectric substrate". As shown in FIG. 6B, on the upper face of the dielectric substrate 1, a ground conductor layer 4, two signal strips 2a, and a ground conductor region 4b are formed. As shown in FIG. 6C, on the lower face of the dielectric substrate 1, two signal strips 2, two ground strips 3 which are disposed so as to leave a predetermined space from the signal strips 2, and a ground conductor region 4c are formed. The signal strips 2a and 2, the ground conductor layer 4, and the ground strips 3 together constitute a grounded coplanar waveguide structure.

One end of each signal strip 2a is connected to the high-frequency element 10 via a wire 11. The wire 11 may be a ribbon or the like. The high-frequency element 10 may be mounted face down, via conductor bumps. In other words, the high-frequency element 10 may be mounted through wireless bonding, e.g., flip chip mounting. The other end of each signal strip 2a is connected to one end of a corresponding signal strip 2, via a through-via 12 for connection purposes which penetrates the dielectric substrate 1. Thus, a high-frequency signal which is output from the high-frequency element 10 or a high-frequency signal which is input to the high-frequency element 10 is transmitted via the wires 11, the signal strips 2a, the through-vias 12, and the signal strips 2, without being grounded.

On the upper face of the dielectric substrate 1, the ground conductor region 4b is disposed directly under the high-frequency element 10, so as to be electrically connected to the ground conductor layer 4. Via a plurality of through-vias 4d penetrating the dielectric substrate 1, the ground conductor region 4b is connected to the ground conductor region 4c formed on the lower face of the dielectric substrate 1. The ground conductor region 4c is electrically connected to the ground strip 3. Thus, a high-frequency ground is provided in the ground conductor region 4d. An arbitrary number of through-vias 5a and four through-vias 5b are formed between the ground conductor layer 4 and the respective ground strips 3, each pair of through-vias 5b being provided near an end of the dielectric substrate 1. The through-vias 5a electrically connect the ground strips 3 to the ground conductor layer 4 to provide a better high-frequency grounding ability. Each pair of opposing through-vias 5b are placed apart from each other by a distance which effectively suppresses the waveguide mode, as described in the first embodiment.

Figure 7A:
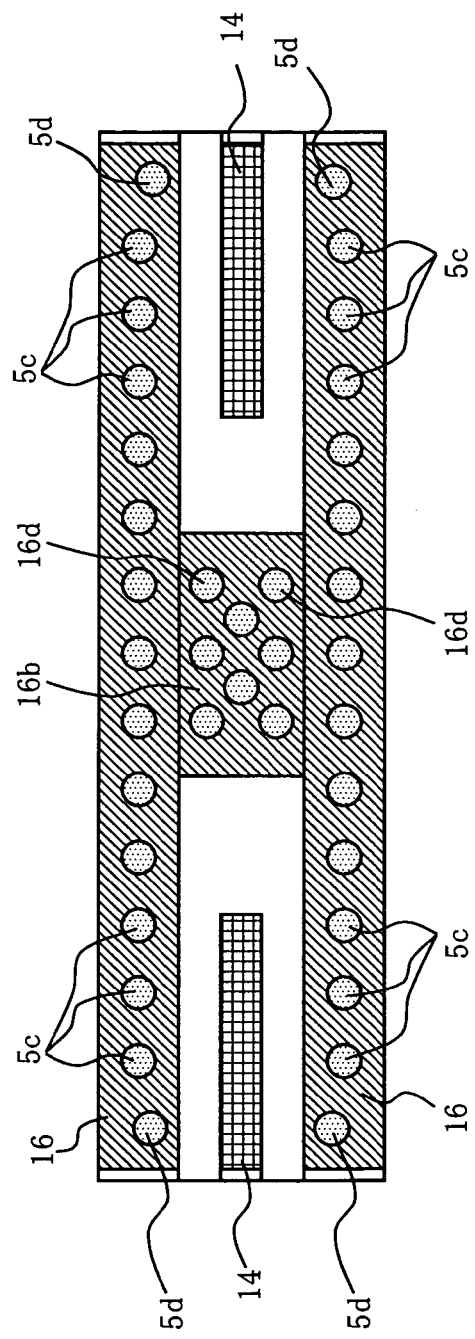
FIG. 7A is a view illustrating a wiring pattern of conductors formed on an upper face of an external circuit substrate 13 shown in FIG. 6A.
Figure 7B:
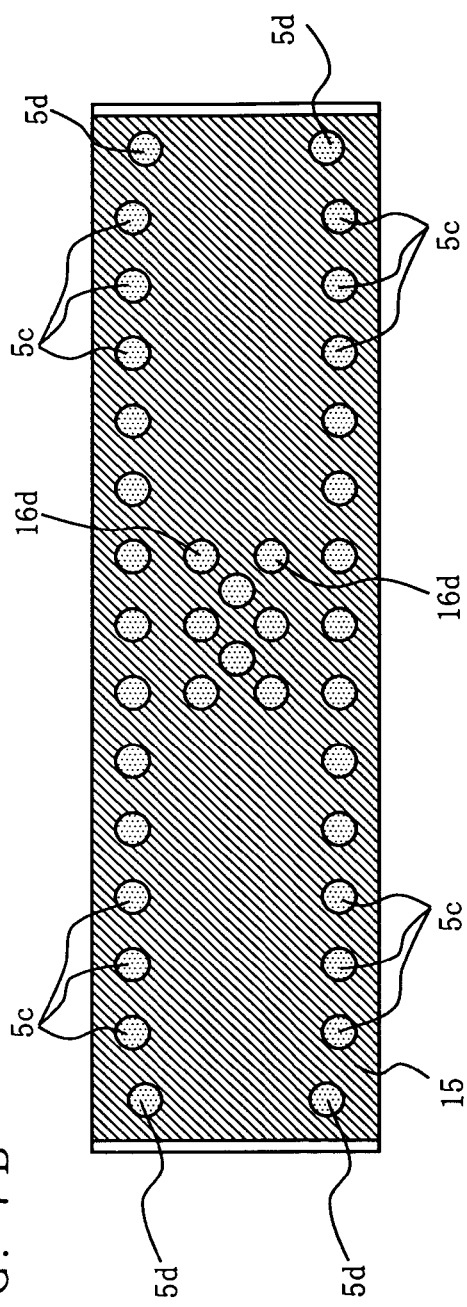
FIG. 7B is a view illustrating a wiring pattern of conductors formed on a lower face of the external circuit substrate 13 shown in FIG. 6A.

FIG. 7A is a view illustrating an exemplary wiring pattern of conductors formed on an upper face of the external circuit substrate 13. FIG. 7B is a view illustrating an exemplary wiring pattern of conductors formed on a lower face of the external circuit substrate 13.

The external circuit substrate 13 is a substrate on which the high-frequency package is to be surface-mounted. As shown in FIG. 7A, on the upper face of the external circuit substrate 13, two signal strips 14, two ground strips 16, and a ground conductor region 16b are formed. As shown in FIG. 7B, on the lower face of the external circuit substrate 13, a ground conductor layer 15 is formed.

Each signal strip 14 is electrically connected to a corresponding signal strip 2 via solder 17. Each ground strip 16 is electrically connected to a corresponding ground strip 3 via solder 17. Interspaces are provided between each signal strip 14 and the ground strips 16.

The ground conductor region 16b is disposed so as to come directly below the high-frequency element 10. The ground conductor region 16b is electrically connected to the ground conductor region 4c via solder 17. The ground conductor region 16b is connected to the ground conductor layer 15 by means of through-vias 16d penetrating the external circuit substrate 13. As a result, a high-frequency ground is provided in the ground conductor region 16d. An arbitrary number of through-vias 5c and four through-vias 5d are formed between the ground conductor layer 15 and the respective ground strips 16, each pair of through-vias 5b being provided near an end of the dielectric substrate 1. The through-vias 5c electrically connect the ground strips 16 to the ground conductor layer 15 to provide a better high-frequency grounding ability. Each pair of opposing through-vias 5d are disposed with a distance which effectively suppresses the waveguide mode, as described in the first embodiment.

Due to the aforementioned strip line structure, the external circuit substrate 13 functions as a grounded coplanar waveguide in which a high-frequency signal which is output from the high-frequency element 10 or a high-frequency signal which is input to the high-frequency element 10 can be transmitted without being grounded.

Thus, according to the fifth embodiment, on both the dielectric substrate and the external circuit substrate, a pair of opposing through-vias provided near the terminating end of a signal strip are disposed with a distance which effectively suppresses the waveguide mode. As a result, the waveguide mode can be suppressed at the terminating end of the signal strip, whereby the radiation loss can be reduced, and a mounting structure which can suppress the transmission loss can be provided.

Although the fifth embodiment illustrates an example where the signal strip has a uniform width, a signal strip which has a narrower width at its terminating end, such as that described in the second embodiment, may instead be used on the dielectric substrate and/or on the external circuit substrate.

Although the fifth embodiment illustrates an example where the ground strips have a uniform width, ground strips which have a thicker width at the terminating end of the signal strip, such as those described in the third embodiment, maybe used instead.

In the fifth embodiment, too, a portion of the ground conductor layer on the dielectric substrate and/or on the external circuit substrate may be removed as in the fourth embodiment.

The fifth embodiment illustrates an example where a grounded coplanar waveguide is constructed over the entire lower face of the dielectric substrate 1 or over the entire upper face of the external circuit substrate 13. However, the strip line structure is not limited to the above, so long as the principle of the present invention is applied. For example, a part of the strip line structure may by a microstrip line.

The ground conductor layer 15 may be formed inside the external circuit substrate 13. By omitting the ground strips 16, the external circuit substrate 13 may be allowed to function as a microstrip line.

In the above-described embodiments, it is preferable that the designed frequency is set equal to or greater than the upper limit frequency value of a range which is used in a given wireless communications system. By prescribing such a designed frequency, the mounted high-frequency element can function without unfavorably affecting its gain, noise, and frequency conversion characteristics.

In the above-described embodiments, it is more preferable that the designed frequency is set equal to or greater than a second harmonic of the upper limit frequency value of a range which is used in a given wireless communications system. By prescribing such a designed frequency, the mounted high-frequency element can function without unfavorably affecting its distortion characteristics.

Figure 8:
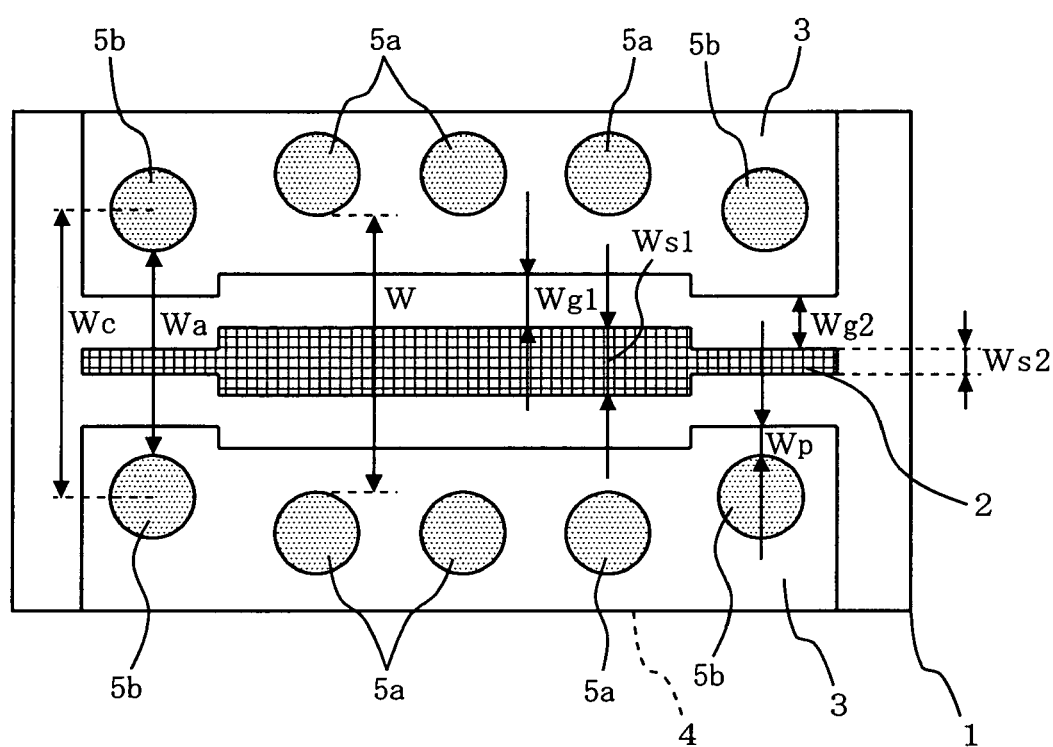
FIG. 8 is a view showing a generic wiring pattern on a wiring substrate on which a high-frequency element was mounted for evaluations as discussed in Examples.
Figure 9A:
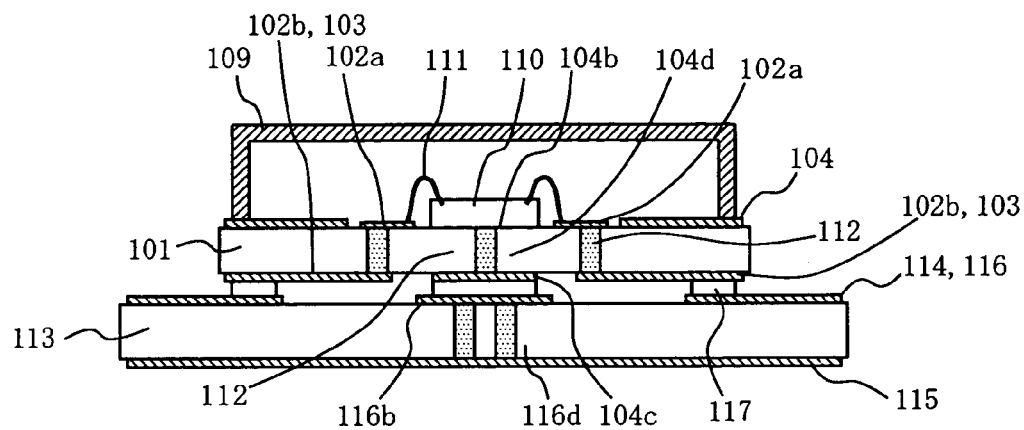
FIG. 9A is a schematic cross-sectional view illustrating a conventional high-frequency package having been surface-mounted on an external circuit substrate.
Figure 9B:
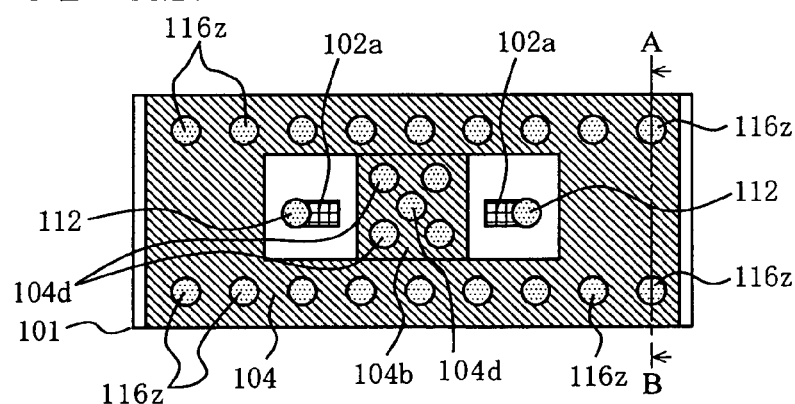
FIG. 9B is a view illustrating a wiring pattern of conductors formed on an upper face of a dielectric substrate 101 shown in FIG. 9A.
Figure 9C:
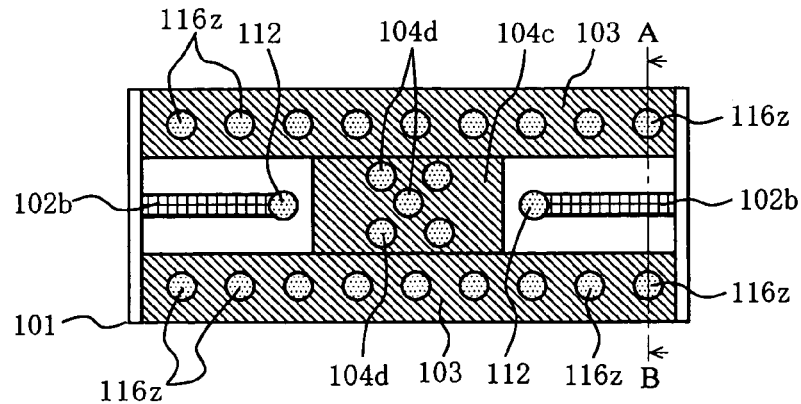
FIG. 9C is a view illustrating a wiring pattern of conductors formed on a lower face of the dielectric substrate 101 shown in FIG. 9A.
Figure 10A:
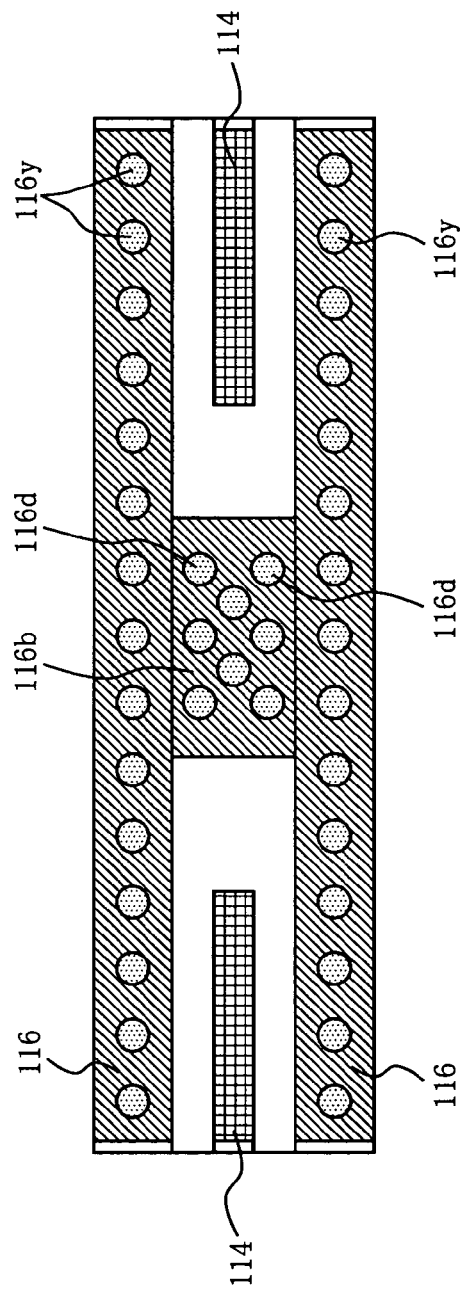
FIG. 10A is a view illustrating an exemplary wiring pattern of conductors formed on an upper face of an external circuit substrate 113.
Figure 10B:
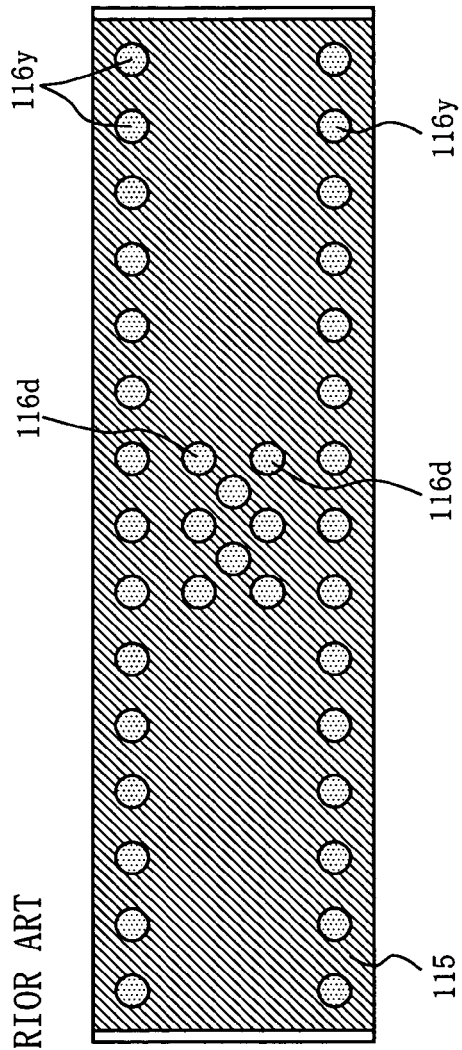
FIG. 10B is a view illustrating an exemplary wiring pattern of conductors formed on a lower face of the external circuit substrate 113.
Figure 11:
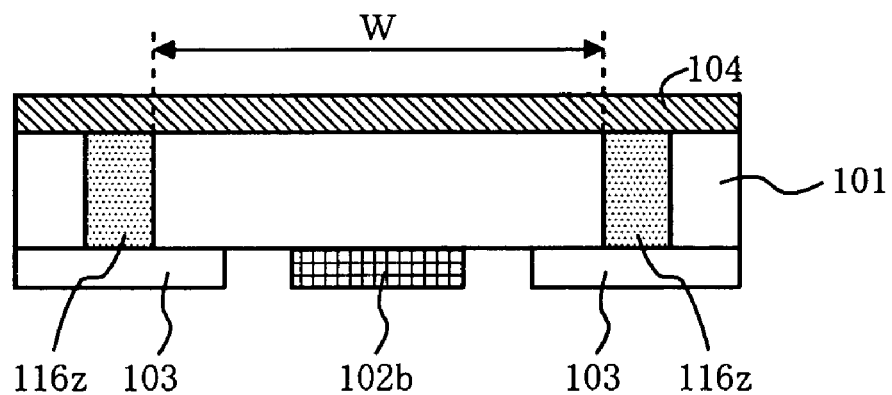
FIG. 11 is a cross-sectional view of the dielectric substrate 101 shown in FIGS. 9B and 9C, taken at line A-B.

In order to ascertain actual effects of the present invention, the inventor has measured the transmission characteristics of various high-frequency circuits according to Examples 1 to 10 described below. FIG. 8 is a view showing a generic wiring pattern on a wiring substrate on which a high-frequency element was mounted for evaluations. It will be appreciated that, once a high-frequency element is mounted on a wiring substrate for evaluations, the structure as shown in FIG. 6A (with or without the external circuit substrate 13) is obtained.

As shown in FIG. 8, each dielectric substrate 1 used for evaluations had the following dimensions: a distance W between each pair of opposing through-vias 5a; a distance Wa between each pair of opposing through-vias 5b; a distance Wc between portions of the through-vias 5b that lie closest to an end (shown as the leftmost end) of the dielectric substrate 1; an interspace Wg1 between a signal strip 2 and either ground strip 3, taken at a central portion of the signal strip 2; an interspace Wg2 between the signal strip 2 and either ground strip 3, taken at a terminating end of the signal strip 2; a width Ws1 of the signal strip 2 at its central portion; a width Ws2 of the signal strip 2 at its terminating end; and a shortest distance Wp from the edge of either ground strip 3 to the surface of each through-via 5b, taken at the terminating end of the signal strip 2. Although FIG. 8 illustrates a generic set of dimensions such that Wg1 is not equal to Wg2 and that Ws1 is not equal to Ws2, it will be understood that Wg1 may be equal to Wg2 and/or Ws1 may be equal to Ws2 in some of the Examples and Comparative Examples below, as clarified in the description accompanying each such Example or Comparative Example First, conditions which were common to all of Examples 1 to 10 are described. In all of Examples 1 to 10, a liquid crystal polymer substrate having a dielectric constant of 3 and a thickness of 125 micrometers was used as the dielectric substrate 1. On the entire upper face of the dielectric substrate 1, a ground conductor layer 4 was formed except for regions within 100 micrometers from the rightmost and leftmost end. Note that the ground conductor layer 4 is disposed on the other side of the dielectric substrate 1 which cannot be drawn in FIG. 8, and is therefore labeled as "4" via a dotted line.

On the lower face of the dielectric substrate 1, the signal strip 2 (having the width Ws1 at its central portion) and two ground strips 3 (each having a width of 600 micrometers) were formed, such that the two ground strips 3 interposed the signal strip 2 with the distance of Wg1 left between either ground strip 3 and the signal strip 2. The dielectric substrate 1 had a length of 2000 micrometers along a direction of signal transmission.

The wiring rules dictate that no conductor should be formed at the very ends of the dielectric substrate 1, which is the reason why the dielectric substrate 1 had a region of 100 micrometers from the rightmost and leftmost end where no conductor is formed. The conductor pattern was composed of copper with a thickness of 40 micrometers. The through-vias 5a and 5b connecting the ground strips 3 to the ground conductor layer 4 were formed by drilling apertures with a radius of 100 micrometers through the dielectric substrate 1, and thereafter plating inner walls of the apertures to an average thickness of 20 micrometers in order to confer conductivity thereto. A void was partially left in each of the through-vias 5a and 5b.

Due to process rule limitations, the minimum value of the shortest distance Wp from the edge of either ground strip 3 to the surface of each through-via 5b was set to 200 micrometers.

As the external circuit substrate, a Teflon® substrate having a dielectric constant of 2.5 and a thickness of 200 micrometers was used. The process rules used for producing the external circuit substrate were the same as the process rules for the dielectric substrate 1.

Table 1 shows S21 and MAG measurements (at 87 GHz) according to Comparative Examples 1 and 2 and Examples 1 and 2. As used herein, "S21" is one of the S parameters concerning transmission characteristics that indicates passing intensity. MAG (Maximum Available Gain) is an index of loss, from which the influences of passage loss-based degradations due to impedance mismatching at the input or output terminal are eliminated. As such, MAG can be used as a more quantitative index of radiation loss. Hereinafter, Comparative Examples 1 and 2 and Examples 1 and 2 will be described with reference to Table 1.

TABLE 1

| | Positioning of through-via pairs on dielectric substrate 1 | | | | | S21 | MAG |
|---|---|---|---|---|---|---|---|
| | Ws2 (μm) | Wg2 (μm) | Wa (μm) | Wc (μm) | W (μm) | (87 GHz)/ dB | (87 GHz)/ dB |
| Comparative Example 1 | 200 | 200 | 1000 | 1200 | 1000 | −4.79 | −2.21 |
| Comparative Example 2 | 200 | 150 | 1000 | 1200 | 1000 | −5.36 | −2.22 |
| Example 1 | 200 | 150 | 950 | 1150 | 1000 | −4.21 | −2.01 |
| Example 2 | 200 | 150 | 900 | 1100 | 1000 | −3.41 | −1.81 |

As common conditions among Comparative Examples 1 and 2 and Examples 1 and 2, Ws1 was prescribed to be 200 micrometers and Wg1 was prescribed to be 200 micrometers, thus constructing a grounded coplanar waveguide having a characteristic impedance 15 of about 50 Ω. The shortest distance W between opposing through-vias 5a was prescribed to be 1000 micrometers. For a 85 GHz signal, a half of the effective wavelength within the dielectric substrate 1 equals 1020 micrometers. Therefore, the cutoff frequency for the waveguide mode is about 85 GHz, i.e., the waveguide mode begins to occur around a frequency of 85 GHz. Thus, it can be seen that Examples 1 and 2 and Comparative Examples 1 and 2 were designed to have a designed frequency of 85 GHz.

In Comparative Example 1, Ws2 was 200 micrometers; Wg2 was 200 micrometers; and the distance Wa between opposing through-vias 5b was 1000 micrometers. Since the radius of the through-vias 5b was 100 micrometers, Wc was 1200 micrometers. As a result, S21 at 87 GHz was measured to be −4.79 dB, and MAG at 87 GHz was measured to be −2.21 dB.

In Comparative Example 2, Ws2 was 200 micrometers; Wg2 was 150 micrometers; and the distance Wa between opposing through-vias 5b was 1000 micrometers. As a result, S21 at 87 GHz was measured to be −5.36 dB, and MAG at 87 GHz was measured to be −2.22 dB.

In Example 1, Ws2 was 200 micrometers; Wg2 was 150 micrometers; and Wa was 950 micrometers. Thus, Wc was 1150 micrometers. Since Wa was 950 micrometers, the cutoff frequency for the waveguide mode near the interspace between each pair of opposing through-vias 5b was about 91 GHz. As a result, S21 at 87 GHz was measured to be −4.21 dB, and MAG at 87 GHz was measured to be −2.01 dB.

In Example 2, Ws2 was 200 micrometers; Wg2 was 150 micrometers; and Wa was 900 micrometers. Thus, Wc was 1100 micrometers. Since Wa was 900 micrometers, the cutoff frequency for the waveguide mode near the interspace between each pair of opposing through-vias 5b was about 96 GHz. As a result, S21 for 87 GHz was measured to be −3.41 dB, and MAG for 87 GHz was measured to be −1.81 dB.

In Table 1, one can see from comparison against Comparative Example 1 that the waveguide mode was suppressed and the passage loss was reduced in Examples 1 and 2, by ensuring that the distance Wa between each pair of opposing through-vias 5b located closest to an end of the substrate was shorter than the distance W between other pairs of opposing through-vias 5a, such that Wa was less than ½ of the effective wavelength corresponding to the designed frequency of 85 GHz.

It was anticipated that passage loss degradation would also occur if there was mismatching between the input or output terminal and a 50 Ω measurement system. Therefore, as a more quantitative index of radiation loss, Table 1 also shows MAG measurements, from which the influences of passage loss-based degradations due to impedance mismatching at the input or output terminal are eliminated. From comparison between the MAG measurements, one could also see that the waveguide mode was suppressed and the radiation loss was reduced by the use of the decreased distance between each pair of opposing through-vias 5b located closest to an end of the substrate according to the present invention. Note that, by comparing Comparative Examples 1 and 2, it can be seen that the use of a reduced Wg2 value at an end of the substrate would lead to a mismatching and hence an increased passage loss. Nonetheless, the passage loss was reduced in Examples 1 and 2, despite the use of the same Ws2 and Wg2 values as in Comparative Example 2. Therefore, it is evident that reduction in passage loss in Examples 1 and 2 as compared to Comparative Example 1 was not due to an alleviation of mismatching, but due to a reduction in radiation loss.

Table 2 shows S21 and MAG measurements (at 87 GHz) according to Comparative Example 3 and Examples 3 and 4. Hereinafter, Comparative Example 3 and Examples 3 and 4 will be described with reference to Table 2.

TABLE 2

| | Positioning of through-via pairs on dielectric substrate 1 | | | | S21 | MAG |
|---|---|---|---|---|---|---|
| | Ws2 (μm) | Wg2 (μm) | Wa (μm) | Wc (μm) | W (μm) | (87 GHz)/ dB | (87 GHz)/ dB |
| Comparative Example 3 | 150 | 150 | 1000 | 1200 | 1000 | −6.21 | −1.88 |
| Example 3 | 150 | 150 | 900 | 1100 | 1000 | −4.02 | −1.59 |
| Example 4 | 150 | 150 | 850 | 1050 | 1000 | −3.39 | −1.47 |

As common conditions among Comparative Example 3 and Examples 3 and 4, Ws1 was prescribed to be 200 micrometers; Wg1 was prescribed to be 200 micrometers; Ws2 was prescribed to be 150 micrometers; Wg2 was prescribed to be 150 micrometers, and W was prescribed to be 1000 micrometers.

In Comparative Example 3, Wa was 1000 micrometers. As a result, S21 at 87 GHz was measured to be −6.21 dB, and MAG at 87 GHz was measured to be −1.88 dB.

In Example 3, Wa was 900 micrometers. Since the radius of the through-vias 5b was 100 micrometers, the distance Wc between portions of the opposing through-vias 5b that lie closest to an end of the substrate 1 was 1100 micrometers. Under this condition, by using Wa instead of W, the cutoff frequency for the waveguide mode near the interspace between each pair of opposing through-vias 5b would be calculated to be about 91 GHz. Similarly, by using Wc instead of W, the cutoff frequency for the waveguide mode near the interspace between each pair of opposing through-vias 5b would be calculated to be about 78 GHz. As a result, S21 at 87 GHz was measured to be −4.02 dB, and MAG at 87 GHz was measured to be −1.59 dB.

In Example 4, Wa was 850 micrometers. Since the radius of the through-vias 5b was 100 micrometers, the distance Wc between portions of the opposing through-vias 5b that lie closest to an end of the substrate 1 was 1050 micrometers. Under this condition, by using Wa instead of W, the cutoff frequency for the waveguide mode near the interspace between each pair of opposing through-vias 5b would be calculated to be about 96 GHz. Similarly, by using Wc instead of W, the cutoff frequency for the waveguide mode near the interspace between each pair of opposing through-vias 5b would be calculated to be about 82.5 GHz. As a result, S21 at 87 GHz was measured to be −3.39 dB, and MAG at 87 GHz was measured to be −1.47 dB.

In Table 2, one can see from comparison against Comparative Example 3 that the waveguide mode was suppressed and the passage loss was reduced in Examples 3 and 4, by prescribing a decreased distance between each pair of opposing through-vias 5b located closest to an end of the substrate according to the present invention, i.e., less than ½ of the effective wavelength corresponding to the designed frequency of 85 GHz. From comparison between the MAG measurements, one could also see that the waveguide mode was suppressed and the radiation loss was reduced by the use of the decreased distance between each pair of opposing through-vias 5b located closest to an end of the substrate according to the present invention.

Table 3 shows S21 and MAG measurements (at 87 GHz) according to Comparative Examples 4 and 5 and Examples 5 to 7. Hereinafter, Comparative Examples 4 and 5 and Examples 5 to 7 will be described with reference to Table 3.

TABLE 3

| | Positioning of through-via pairs on dielectric substrate 1 | | | | | S21 (87 GHz)/ dB | MAG (87 GHz)/ dB |
|---|---|---|---|---|---|---|---|
| | Ws2 (μm) | Wg2 (μm) | Wa (μm) | Wc (μm) | W (μm) | | |
| Comparative Example 4 | 150 | 100 | 1000 | 1200 | 1000 | −6.43 | −1.84 |
| Example 5 | 150 | 100 | 900 | 1100 | 1000 | −3.78 | −1.58 |
| Example 6 | 150 | 100 | 800 | 1000 | 1000 | −2.47 | −1.37 |
| Example 7 | 150 | 100 | 750 | 950 | 1000 | −2.39 | −1.36 |
| Comparative Example 5 | 150 | 100 | 1000 | 1200 | 1000, 800 | −5.8 | −1.96 |

As common conditions among Comparative Example 4 and Examples 5 to 7, Ws1 was prescribed to be 200 micrometers; Wg1 was prescribed to be 200 micrometers; Ws2 was prescribed to be 150 micrometers; Wg2 was prescribed to be 100 micrometers; and W was prescribed to be 1000 micrometers.

In Comparative Example 4, Wa was 1000 micrometers. As a result, S21 at 87 GHz was measured to be −6.43 dB, and MAG at 87 GHz was measured to be −1.84 dB.

In Example 5, Wa was 900 micrometers. Thus, Wc was 1100 micrometers. Under this condition, by using Wa instead of W, the cutoff frequency for the waveguide mode near the interspace between each pair of opposing through-vias 5b would be calculated to be about 91 GHz. Similarly, by using Wc instead of W, the cutoff frequency for the waveguide mode near the interspace between each pair of opposing through-vias 5b would be calculated to be about 78 GHz. As a result, S21 at 87 GHz was measured to be −3.78 dB, and MAG at 87 GHz was measured to be −1.58 dB.

In Example 6, Wa was 800 micrometers. Thus, Wc was 1000 micrometers. Under this condition, by using Wa instead of W, the cutoff frequency for the waveguide mode near the interspace between each pair of opposing through-vias 5b would be calculated to be about 101 GHz. Similarly, by using Wc instead of W, the cutoff frequency for the waveguide mode near the interspace between each pair of opposing through-vias 5b would be calculated to be about 87

GHz. As a result, S21 at 87 GHz was measured to be −2.47 dB, and MAG at 87 GHz was measured to be −1.37 dB.

In Example 7, Wa was 750 micrometers. Thus, Wc was 950 micrometers. Under this condition, by using Wa instead of W, the cutoff frequency for the waveguide mode near the interspace between each pair of opposing through-vias 5b would be calculated to be about 106 GHz. Similarly, by using Wc instead of W, the cutoff frequency for the waveguide mode near the interspace between each pair of opposing through-vias 5b would be calculated to be about 91 GHz. As a result, S21 at 87 GHz was measured to be −2.39 dB, and MAG at 87 GHz was measured to be −1.36 dB.

In Comparative Example 5, Wa was for the most part 1000 micrometers, except that the opposing distance W between each of two pairs of opposing through-vias 5a (such that each pair was located the second closest to an end of the substrate) was 800 micrometers. As a result, S21 at 87 GHz was measured to be −5.8 dB, and MAG at 87 GHz was measured to be −1.96 dB.

In Table 3, one can see from comparison against Comparative Example 4 that the waveguide mode was suppressed and the passage loss was reduced in Examples 5 to 7, by prescribing a decreased distance between each pair of opposing through-vias 5b located closest to an end of the substrate according to the present invention, i.e., less than ½ of the effective wavelength corresponding to the designed frequency of 85 GHz. From comparison between the MAG measurements, one could also see that the waveguide mode was suppressed and the radiation loss was reduced by the use of the decreased distance between each pair of opposing through-vias 5b located closest to an end of the substrate according to the present invention.

Moreover, in the region at either end of the substrate, the condition for preventing the 87 GHz signal to be transmitted from being converted to the waveguide mode is that the distance Wc between portions of the opposing through-vias 5b that lie closest to an end of the substrate 1 be less than 1000 micrometers, i.e., ½ of the effective wavelength corresponding to the designed frequency of 87 GHz within the dielectric substrate 1. The validity of the principle of the present invention is clear from the fact that the passage loss and MAG measurements for Example 6, which sufficiently satisfies this condition, and Example 7, which employs an even shorter value of Wc, each converge to toward a similar value.

A comparison between Comparative Examples 4 and 5 would indicate the following. In Comparative Examples 4 and 5, Wg2 was reduced to 100 micrometers in order to obtain a minimum Wp value of 200 micrometers in the neighborhood of the through-vias 5a and 5b. As shown in Table 3, there are differences in matching between Comparative Examples 4 and 5, so that the characteristics of Comparative Examples 4 and 5 are not entirely identical. However, the characteristics of Comparative Example 5 are closer to those of Comparative Example 4 than those of Example 6, in terms of both passage loss and MAG. In other words, the improved characteristics of Example 6 as compared to Comparative Example 4 are not obtained in Comparative Example 5, which employ a decreased distance between opposing through-vias 5a. Thus, it is clear that what is most effective according to the present invention is to reduce the distance Wa between a pair of opposing through-vias 5b in the region near either end of the substrate, rather than reducing the distance W between any pair of opposing through-vias 5a in regions other than the ends of the substrate.

Table 4 shows S21 and MAG measurements (at 87 GHz) according to Comparative Examples 4 and 6 and Examples 6 and 8. Hereinafter, Comparative Examples 4 and 6 and Examples 6 and 8 will be described with reference to Table 4.

TABLE 4

| | Positioning of through-via pairs on dielectric substrate 1 | | | | | partial removal of ground conductor layer | S21 (87 GHz)/ dB | MAG (87 GHz)/ dB |
|---|---|---|---|---|---|---|---|---|
| | Ws2 (μm) | Wg2 (μm) | Wa (μm) | Wc (μm) | W (μm) | | | |
| Comparative Example 4 | 150 | 100 | 1000 | 1200 | 1000 | NO | −6.43 | −1.84 |
| Comparative Example 6 | 150 | 100 | 1000 | 1200 | 1000 | YES | −4.93 | −0.99 |
| Example 6 | 150 | 100 | 800 | 1000 | 1000 | NO | −2.47 | −1.37 |
| Example 8 | 150 | 100 | 800 | 1000 | 1000 | YES | −1.55 | −0.65 |

The conditions and measurement results of Comparative Example 4 and Example 6 were the same as those shown in Table 3. Comparative Example 6 was constructed similarly to Comparative Example 4 except that the ground conductor layer 4 formed on the upper face of the dielectric substrate 1 was partially removed. As shown in FIG. 5B, the portions which were removed from the ground conductor layer 4 were, within a region located near either end of the substrate and away from the region where the through-vias 5b oppose each other, portions opposing a terminating end of the signal strip 2. Example 8 was constructed similarly to Example 6 except that the ground conductor layer 4 was partially removed in the same manner as in Comparative Example 6.

In Table 4, one can see from comparing the characteristics of Examples 6 and 8 that a partial removal of the ground conductor layer 4 improved the passage loss and MAG characteristics.

Comparative Examples 4 and 6 indicate that some improvement in the passage loss and MAG characteristics could be obtained by merely removing portions of the ground conductor layer 4. Nevertheless, it should be clear from Example 8 and Comparative Example 6 that a more drastic improvement in the characteristics can be obtained by reducing the distance Wa between opposing through-vias 5b in addition to removing portions of the ground conductor layer 4.

Table 5 shows S21 and MAG measurements (at 87 GHz) according to Examples 7, 9, and 10. Hereinafter, Examples 7, 9, and 10 will be described with reference to Table 5.

TABLE 5

| | Positioning of through-via pairs on dielectric substrate 1 | | | | Positioning of through-via pairs (closest to end) on external circuit substrate | S21 (87 GHz)/ dB | MAG (87 GHz)/ dB |
|---|---|---|---|---|---|---|---|
| | Ws2 (μm) | Wg2 (μm) | Wa (μm) | Wc (μm) | W (μm) | | |
| Example 7 | 150 | 100 | 750 | 950 | 1000 same as conventional | −2.39 | −1.36 |
| Example 9 | 150 | 100 | 750 | 950 | 1000 inventive (900 μm apart) | −1.8 | −1.22 |
| Example 10 | 150 | 100 | 750 | 950 | 1000 inventive (800 μm apart) | −1.75 | −1.19 |

In Examples 9 and 10, the wiring pattern on the dielectric substrate 1 was similar to that in Example 7; however, the through-via pattern described in the fifth embodiment of the present invention was adopted for the external circuit substrate 13. The following description will therefore refer to FIGS. 7A and 7B.

In Example 7, among the through-vias 5c and 5d connecting the ground conductor layer 15 formed on the lower face of the external circuit substrate 13 to the ground strips 16 disposed on both sides of the signal strip 14 formed on the upper face of the external circuit substrate 13, each pair of opposing through-vias 5d near the terminating end of each signal strip 14 were disposed apart by the conventional distance of 1000 micrometers. Under this condition, by using the distance between each pair of opposing through-vias 5b located closest to the connecting portions, the cutoff frequency for the waveguide mode in signal transmission within the external circuit substrate would be calculated to be about 94 GHz. Meanwhile, since the radius of the through-vias 5d was 100 micrometers, the opposing distance between portions of the through-vias 5d that lie closest to the connection with an external element was 1200 micrometers. Under this condition, the cutoff frequency for the waveguide mode near the connection would be calculated to be about 78 GHz. As a result, S21 at 87 GHz was −2.39 dB, and MAG at 87 GHz was −1.36 dB.

In Example 9, the distance between opposing through-vias 5d was 900 micrometers. Under this condition, by using the distance between each pair of opposing through-vias 5b located closest to the connecting portions, the cutoff frequency for the waveguide mode in signal transmission within the external circuit substrate would be calculated to be about 104 GHz. Meanwhile, since the radius of the through-vias 5d was 100 micrometers, the opposing distance between portions of the through-vias 5d that lie closest to the connection with an external element was 1100 micrometers. Under this condition, the cutoff frequency for the waveguide mode near the connection would be calculated to be about 85 GHz. As a result, S21 at 87 GHz was −1.8 dB, and MAG at 87 GHz was −1.22 dB.

In Example 10, the distance between opposing through-vias 5d was 800 micrometers. Under this condition, by using the distance between each pair of opposing through-vias 5b located closest to the connecting portions, the cutoff frequency for the waveguide mode in signal transmission within the external circuit substrate would be calculated to be about 118 GHz. Meanwhile, since the radius of the through-vias 5d was 100 micrometers, the opposing distance between portions of the through-vias 5d that lie closest to the connection with an external element was 900 micrometers. Under this condition, the cutoff frequency for the waveguide mode near the connection would be calculated to be about 104 GHz. As a result, S21 at 87 GHz was −1.75 dB, and MAG at 87 GHz was −1.19 dB.

In Table 5, one can see from comparison against Example 7 that both the passage loss and the MAG characteristics were more improved in Examples 9 and 10. Thus, it is clear that on the external circuit substrate 13, too, the advantageous effects of suppressing the waveguide mode and reducing the passage loss can be obtained by reducing the distance between opposing through-vias 5d located closest to an end of the substrate so as to be less than ½ of the effective wavelength corresponding to the designed frequency of 94 GHz.

The high-frequency circuit according to the present invention can reduce the loss associated with the transmission of high-frequency signals, and is therefore useful in fields such as communications.

While the invention has been described in detail, the foregoing description is in all aspects illustrative and not restrictive. It is understood that numerous other modifications and variations can be devised without departing from the scope of the invention.

What is claimed is:

1. A high-frequency circuit formed on a surface of a dielectric substrate, comprising:
   a signal strip formed on a first face of the dielectric substrate for transmitting a signal therethrough;
   a pair of ground strips formed on the first face astride the signal strip, with an interspace on each side of the signal strip;
   a ground conductor layer formed on a second face of the dielectric substrate, the second face being opposite to the first face; and
   a plurality of through-vias formed in the dielectric substrate astride the signal strip for electrically connecting the pair of ground strips to the ground conductor layer,
   wherein, among the plurality of through-vias, first and second through-vias which are a pair of opposing through-vias located closest to a terminating end of the signal strip are disposed apart from each other by a distance smaller than a distance between any other pair of opposing through-vias,
   the distance between the first and second through-vias is less than ½ of an effective wavelength corresponding to a designed frequency, and the distance between any other pair of opposing through-vias is equal to or less than ½ of the effective wavelength corresponding to the designed frequency.

2. The high-frequency circuit according to claim 1, wherein portions of the ground conductor layer opposing the signal strip are removed.

3. The high-frequency circuit according to claim 1, wherein,
the terminating end of the signal strip is near an end of the dielectric substrate, and
the first and second through-vias are disposed so that a distance between portions thereof that lie closest to the end of the dielectric substrate is less than ½ of the effective wavelength corresponding to the designed frequency.

4. The high-frequency circuit according to claim 1, wherein the first and second through-vias are each disposed so as to be away from an end of the ground conductor layer by a distance which is less than ¼ of the effective wavelength corresponding to the designed frequency.

5. The high-frequency circuit according to claim 1, wherein the signal strip is narrower at the terminating end than at any other portion.

6. The high-frequency circuit according to claim 1, wherein an interspace between the signal strip and each ground strip is narrower at the terminating end of the signal strip than at any other portion.

7. The high-frequency circuit according to claim 1, wherein the dielectric substrate is a resin substrate having a low dielectric constant.

8. The high-frequency circuit according to claim 1, wherein portions of the ground conductor layer interposed between the first and the second through-via and opposing the signal strip are eliminated.

9. The high-frequency circuit according to claim 1, wherein, within a region extending nearer to an end of the substrate than to a region interposed between the first and second through-vias, portions of the ground conductor layer opposing the signal strip are eliminated.

10. A high-frequency package into which an integrated circuit is packaged, comprising:
a high-frequency element composed of the integrated circuit for processing a high-frequency signal; and
a dielectric substrate on which the high-frequency element is mounted, wherein the dielectric substrate includes:
a signal strip formed on a first face of the dielectric substrate for transmitting a signal therethrough;
a pair of ground strips formed on the first face astride the signal strip, with an interspace on each side of the signal strip;
a ground conductor layer formed on a second face of the dielectric substrate, the second face being opposite to the first face; and
a plurality of through-vias formed in the dielectric substrate astride the signal strip for electrically connecting the pair of ground strips to the ground conductor layer,
wherein, among the plurality of through-vias, first and second through-vias which are a pair of opposing through-vias located closest to a terminating end of the signal strip are disposed apart from each other by a distance smaller than a distance between any other pair of opposing through-vias,
the distance between the first and second through-vias is less than ½ of an effective wavelength corresponding to a designed frequency, and
the distance between any other pair of opposing through-vias is equal to or less than ½ of the effective wavelength corresponding to the designed frequency.

11. The high-frequency package according to claim 10, wherein,
the terminating end of the signal strip is near an end of the dielectric substrate, and
the first and second through-vias are disposed so that a distance between portions thereof that lie closest to the end of the dielectric substrate is less than ½ of the effective wavelength corresponding to the designed frequency.

12. The high-frequency package according to claim 10, further comprising a cover for protecting the high-frequency element.

13. The high-frequency package according to claim 10, further comprising a mounting-side dielectric substrate on which the dielectric substrate is mounted,
wherein the mounting-side dielectric substrate includes:
a mounting-side signal strip formed on a first mounting face of the mounting-side dielectric substrate so as to be connected to the signal strip for transmitting the signal therethrough;
a pair of mounting-side ground strips formed on the first mounting face astride the mounting-side signal strip, with an interspace on each side of the mounting-side signal strip;
a mounting-side ground conductor layer formed on a second mounting face of the mounting-side dielectric substrate, the second mounting face being opposite to the first mounting face; and
a plurality of mounting-side through-vias formed in the mounting-side dielectric substrate astride the mounting-side signal strip for electrically connecting the pair of mounting-side ground strips to the mounting-side ground conductor layer,
wherein, among the plurality of mounting-side through-vias, first and second mounting-side through-vias which are a pair of opposing mounting-side through-vias located closest to a terminating end of the mounting-side signal strip are disposed apart from each other by a distance smaller than a distance between any other pair of opposing mounting-side through-vias.

14. The high-frequency package according to claim 13, wherein,
the distance between the first and second mounting-side through-vias is less than ½ of an effective wavelength corresponding to a designed frequency, and
the distance between any other pair of opposing mounting-side through-vias is equal to or less than ½ of the effective wavelength corresponding to the designed frequency.

15. The high-frequency package according to claim 14, wherein,
the terminating end of the mounting-side signal strip is near an end of the mounting-side dielectric substrate, and
the first and second mounting-side through-vias are disposed so that a distance between portions thereof that lie closest to the end of the mounting-side dielectric substrate is less than ½ of the effective wavelength corresponding to the designed frequency.

16. A high-frequency circuit formed on a surface of a dielectric substrate on which a high-frequency package is to be surface-mounted, the high-frequency package having a coplanar waveguide formed on a lower face thereof, comprising:

a signal strip formed on a first face of the dielectric substrate so as to be connected to the high-frequency package for transmitting a signal therethrough;

a pair of ground strips formed on the first face astride the signal strip, with an interspace on each side of the signal strip;

a ground conductor layer formed on a second face of the dielectric substrate, the second face being opposite to the first face; and a plurality of through-vias formed in the dielectric substrate astride the signal strip for electrically connecting the pair of ground strips to the ground conductor layer, wherein, among the plurality of through-vias, first and second through-vias which are a pair of opposing through-vias located closest to a terminating end of the signal strip are disposed apart from each other by a distance smaller than a distance between any other pair of opposing through-vias, the distance between the first and second through-vias is less than ½ of an effective wavelength corresponding to a designed frequency, and the distance between any other pair of opposing through-vias is equal to or less than ½ of the effective wavelength corresponding to the designed frequency.

17. The high-frequency circuit according to claim 16, wherein, the terminating end of the signal strip is near an end of the dielectric substrate, and the first and second through-vias are disposed so that a distance between portions thereof that lie closest to the end of the dielectric substrate is less than ½ of the effective wavelength corresponding to the designed frequency.

* * * * *